United States Patent [19]
Crockett et al.

[11] Patent Number: 5,721,514
[45] Date of Patent: Feb. 24, 1998

[54] DIGITAL FREQUENCY GENERATION IN ATOMIC FREQUENCY STANDARDS USING DIGITAL PHASE SHIFTING

[75] Inventors: Jeff D. Crockett, Fullerton; Gerold L. Skoczen, Chino Hills, both of Calif.

[73] Assignee: Efratom Time and Frequency Products, Inc., Irvine, Calif.

[21] Appl. No.: 678,296

[22] Filed: Jul. 11, 1996

Related U.S. Application Data

[60] Provisional application No. 60/007,610, Nov. 22, 1995.
[51] Int. Cl.$^6$ .............................. H03B 17/00; H03L 7/26
[52] U.S. Cl. .................................... 331/3; 331/94.1
[58] Field of Search .......................... 331/3, 94.1

[56] References Cited

U.S. PATENT DOCUMENTS

| | | | |
|---|---|---|---|
| 4,122,408 | 10/1978 | Walls | 331/3 |
| 4,314,208 | 2/1982 | Munday | 331/3 |
| 4,316,153 | 2/1982 | Busca et al. | 331/94.1 X |
| 4,331,933 | 5/1982 | Allan et al. | 331/94.1 X |
| 4,446,446 | 5/1984 | Fowks | 331/3 |
| 4,449,105 | 5/1984 | Frank et al. | 331/1 A |
| 4,476,445 | 10/1984 | Riley, Jr. | 331/3 |
| 4,692,716 | 9/1987 | De Marchi et al. | 331/3 |
| 4,740,761 | 4/1988 | Barnes et al. | 331/3 |
| 5,491,451 | 2/1996 | English | 331/3 |

OTHER PUBLICATIONS

Proceedings of the 6th European Frequency and Time Forum, Mar. 1992. "High Resolution Digital Synthesizer For A Rb Frequency Standard"; Detoma, E. et al; pp. 457–469.

Primary Examiner—David Mis
Attorney, Agent, or Firm—Brinks Hofer Gilson & Lione

[57] ABSTRACT

In the generation of frequency-modulated interrogation frequencies for atomic frequency standards, the modulation characteristics can be tailored to the frequency discrimination characteristics of a physics package. The rate of phase change of a digital pulse train providing a frequency-modulated component of interrogation frequency for an atomic frequency standard can be varied, for example, by multiplexing a plurality of differently phased (delayed) pulse trains to vary the rate of phase change in a digital interrogation frequency component, or by effecting phase delays and phase advances through the addition and subtraction of pulses of a digital interrogation frequency component. In addition, fine frequency and/or modulation depth control, which can overcome physics package frequency offsets, can be effected through the addition and/or subtraction of increments of phase to and/or from a digital frequency component of the interrogation frequency at a variable phase change frequency (or drop rate count) to provide variable rates of phase change in alternate half-cycles of the modulation frequency in the synthesis of a frequency-modulated interrogation signal.

40 Claims, 29 Drawing Sheets

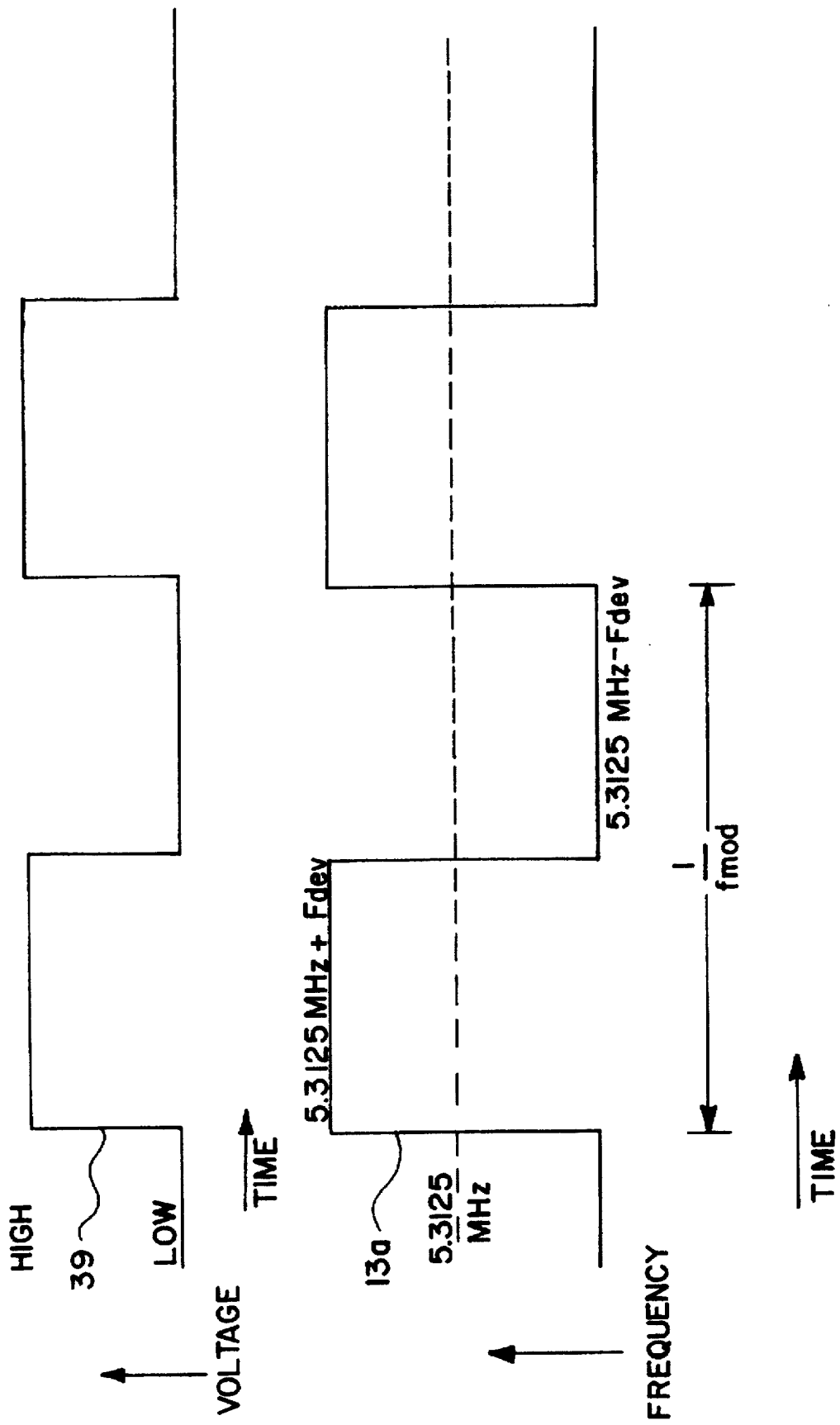

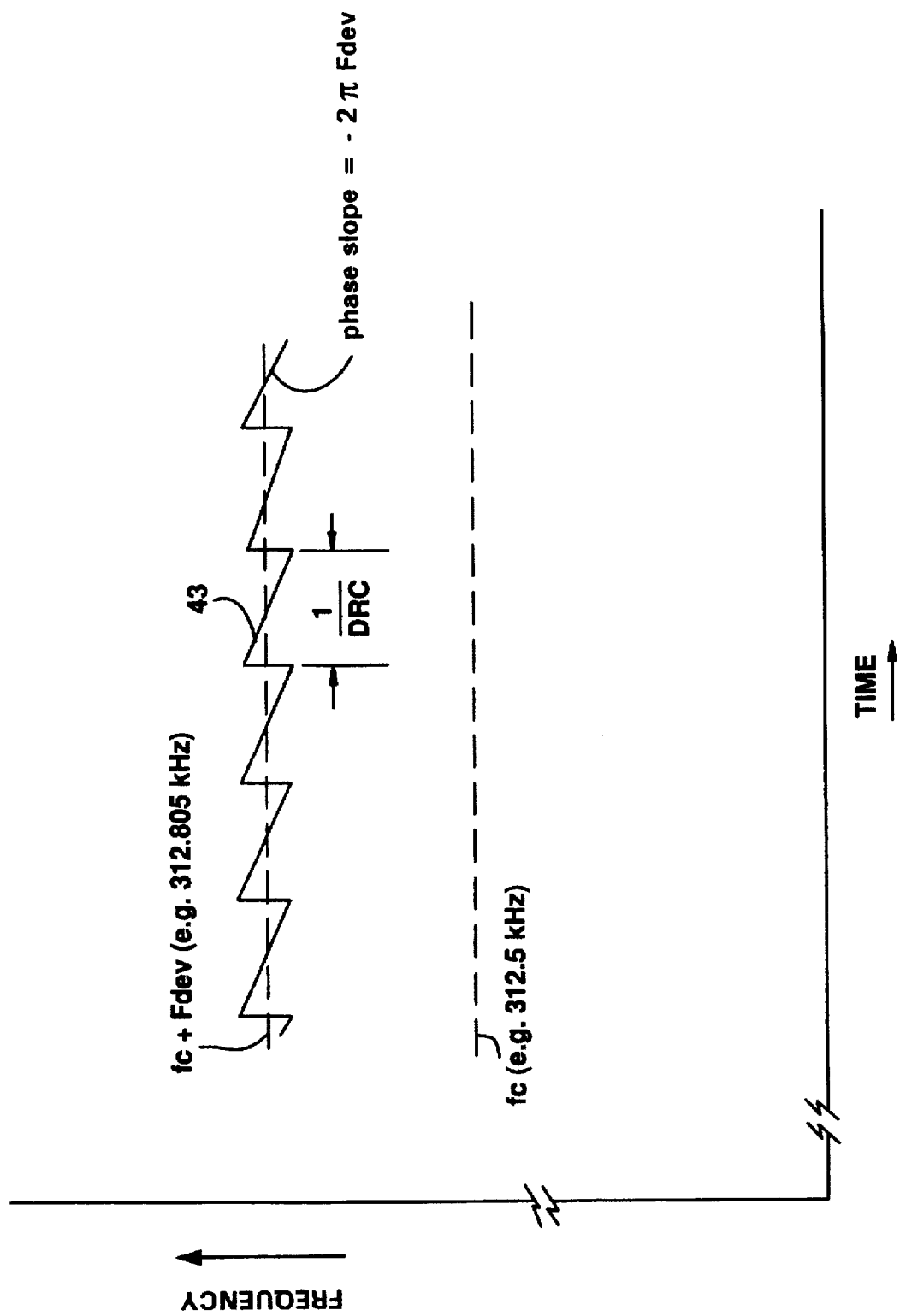

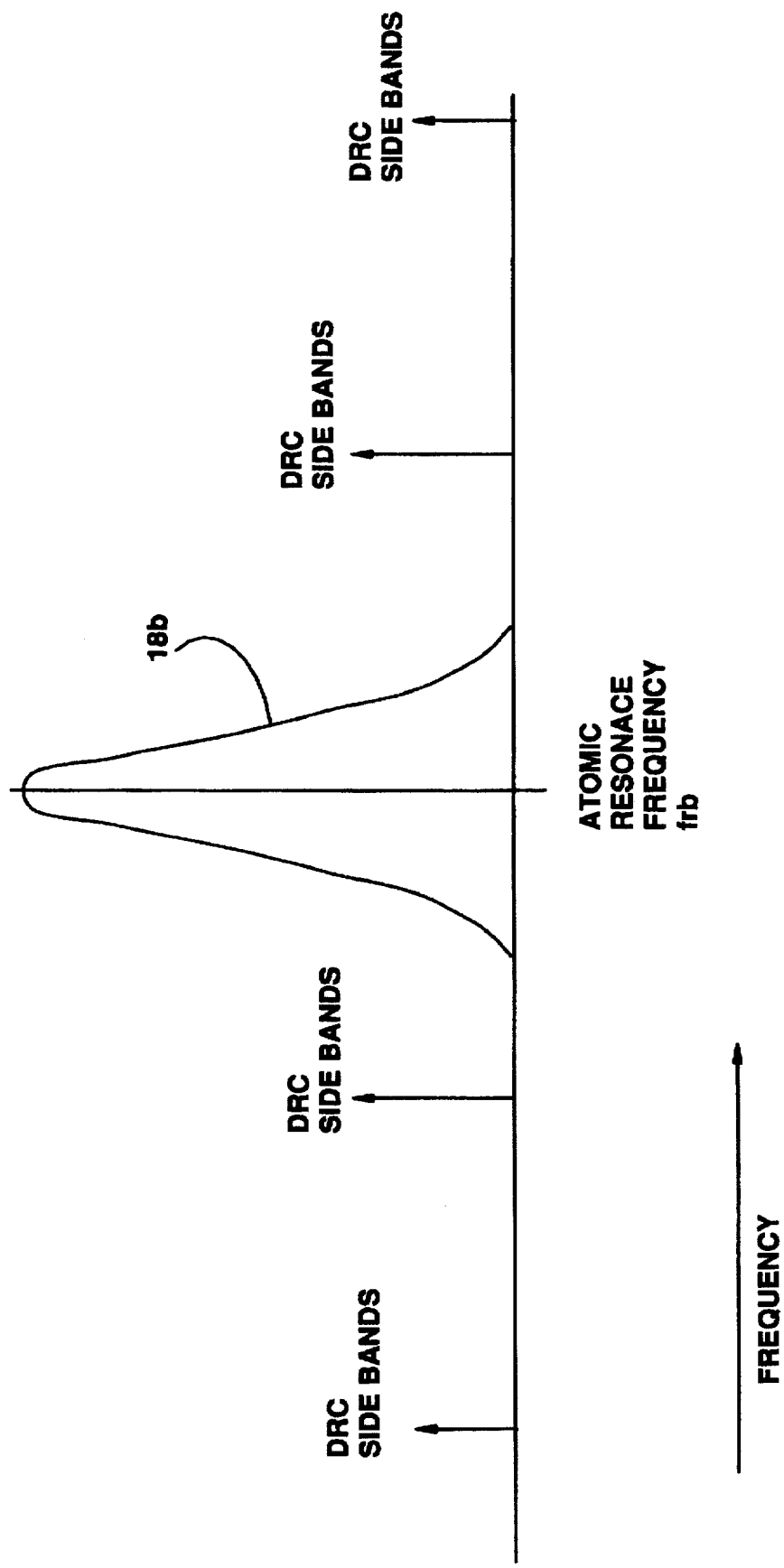

FIG. 9A

Modulated Counter Chain Calculations   f clock = 20,000,000 Hz.

| Divider | Div/16 | DRC | Clk-DRC | Clk+DRC | Mixer- | Mixer+ | Delta F | Delta Unit | PClk | Fmod |
|---|---|---|---|---|---|---|---|---|---|---|
| 1024 | 64 | 19531.25 | 19980469 | 20019531 | 312194.8 | 312805.2 | 610.3516 | 0.00E+00 | 4882.813 | 152.5879 |
| 400 | 25 | 50000 | 19950000 | 20050000 | 311718.8 | 313281.3 | 1562.5 | 0.00E+00 | 4545.455 | 142.0455 |
| 416 | 26 | 48076.92 | 19951923 | 20048077 | 311748.8 | 313251.2 | 1502.404 | 0.00E+00 | 4370.629 | 136.5822 |
| 432 | 27 | 46296.3 | 19953704 | 20046296 | 311776.6 | 313223.4 | 1446.759 | 0.00E+00 | 4629.63 | 144.6759 |
| 448 | 28 | 44642.86 | 19955357 | 20044643 | 311802.5 | 313197.5 | 1395.089 | 0.00E+00 | 4464.286 | 139.5089 |
| 464 | 29 | 43103.45 | 19956897 | 20043103 | 311826.5 | 313173.5 | 1346.983 | 0.00E+00 | 4310.345 | 134.6983 |
| 480 | 30 | 41666.67 | 19958333 | 20041667 | 311849 | 313151 | 1302.083 | 0.00E+00 | 4629.63 | 144.6759 |
| 496 | 31 | 40322.58 | 19959677 | 20040323 | 311870 | 313130 | 1260.081 | 0.00E+00 | 4480.287 | 140.009 |
| 512 | 32 | 39062.5 | 19960938 | 20039063 | 311889.6 | 313110.4 | 1220.703 | 0.00E+00 | 4340.278 | 135.6337 |
| 528 | 33 | 37878.79 | 19962121 | 20037879 | 311908.1 | 313091.9 | 1183.712 | 0.00E+00 | 4734.848 | 147.964 |
| 544 | 34 | 36764.71 | 19963235 | 20036765 | 311925.8 | 313074.4 | 1148.897 | 0.00E+00 | 4595.588 | 143.6121 |
| 560 | 35 | 35714.29 | 19964286 | 20035714 | 311942 | 313058 | 1116.071 | 0.00E+00 | 4464.286 | 139.5089 |
| 576 | 36 | 34722.22 | 19965278 | 20034722 | 311957.5 | 313042.5 | 1085.069 | 0.00E+00 | 4340.278 | 135.6337 |
| 592 | 37 | 33783.78 | 19966216 | 20033784 | 311972.1 | 313027.9 | 1055.743 | 0.00E+00 | 4222.973 | 131.9679 |
| 608 | 38 | 32894.74 | 19967105 | 20032895 | 311986 | 313014 | 1027.961 | 0.00E+00 | 4699.248 | 146.8515 |
| 624 | 39 | 32051.28 | 19967949 | 20032051 | 311999.2 | 313000.8 | 1001.603 | 0.00E+00 | 4578.755 | 143.0861 |
| 640 | 40 | 31250 | 19968750 | 20031250 | 312011.7 | 312988.3 | 976.5625 | 0.00E+00 | 4464.286 | 139.5089 |
| 656 | 41 | 30487.8 | 19969512 | 20030488 | 312023.6 | 312976.4 | 952.7439 | 0.00E+00 | 4355.401 | 136.1063 |
| 672 | 42 | 29761.9 | 19970238 | 20029762 | 312035 | 312965 | 930.0595 | 0.00E+00 | 4251.701 | 132.8656 |
| 688 | 43 | 29069.77 | 19970930 | 20029070 | 312045.8 | 312954.2 | 908.4302 | 0.00E+00 | 4844.961 | 151.405 |
| 704 | 44 | 28409.09 | 19971591 | 20028409 | 312056.1 | 312943.9 | 887.7841 | 0.00E+00 | 4734.848 | 147.964 |
| 720 | 45 | 27777.78 | 19972222 | 20027778 | 312066 | 312934 | 868.0556 | 0.00E+00 | 4629.63 | 144.6759 |
| 736 | 46 | 27173.91 | 19972826 | 20027174 | 312075.4 | 312924.6 | 849.1848 | 0.00E+00 | 4528.986 | 141.5308 |
| 752 | 47 | 26595.74 | 19973404 | 20026596 | 312084.4 | 312915.6 | 831.117 | 0.00E+00 | 4432.624 | 138.5195 |
| 768 | 48 | 26041.67 | 19973958 | 20026042 | 312093.1 | 312906.9 | 813.8021 | 0.00E+00 | 4340.278 | 135.6337 |
| 784 | 49 | 25510.2 | 19974490 | 20025510 | 312101.4 | 312898.6 | 797.1939 | 0.00E+00 | 4251.701 | 132.8656 |
| 800 | 50 | 25000 | 19975000 | 20025000 | 312109.4 | 312890.6 | 781.25 | 0.00E+00 | 4166.667 | 130.2083 |

FIG. 9B

Modulated Counter Chain Calculations    f clock = 20,000,000 Hz.

| Divider | Div/16 | DRC | Clk÷DRC | Clk÷DRC | Mixer+ | Mixer- | Delta F | Delta Unit | PClk | Fmod |
|---|---|---|---|---|---|---|---|---|---|---|
| 800 | 50 | 25000 | 19975000 | 20025000 | 312109.4 | 312890.6 | 781.25 | 0.00E+00 | 4168.667 | 130.2083 |
| 816 | 51 | 24509.8 | 19975490 | 20024510 | 312117 | 312883 | 765.9314 | 0.00E+00 | 4901.961 | 153.1863 |
| 832 | 52 | 24038.46 | 19975962 | 20024038 | 312124.4 | 312875.6 | 751.2019 | 0.00E+00 | 4807.692 | 150.2404 |
| 848 | 53 | 23584.91 | 19976415 | 20023585 | 312131.5 | 312868.5 | 737.0283 | 0.00E+00 | 4716.981 | 147.4057 |
| 864 | 54 | 23148.15 | 19976852 | 20023148 | 312138.3 | 312861.7 | 723.3796 | 0.00E+00 | 4629.63 | 144.6759 |
| 880 | 55 | 22727.27 | 19977273 | 20022727 | 312144.9 | 312855.1 | 710.2273 | 0.00E+00 | 4545.455 | 142.0455 |
| 896 | 56 | 22321.43 | 19977679 | 20022321 | 312151.2 | 312848.8 | 697.5446 | 0.00E+00 | 4464.286 | 139.5089 |
| 912 | 57 | 21929.82 | 19978070 | 20021930 | 312157.3 | 312842.7 | 685.307 | 0.00E+00 | 4385.965 | 137.0614 |
| 928 | 58 | 21551.72 | 19978448 | 20021552 | 312163.3 | 312836.7 | 673.4914 | 0.00E+00 | 4310.345 | 134.6983 |
| 944 | 59 | 21186.44 | 19978814 | 20021186 | 312169 | 312831 | 662.0763 | 0.00E+00 | 4237.288 | 132.4153 |
| 960 | 60 | 20833.33 | 19979167 | 20020833 | 312174.5 | 312825.5 | 651.0417 | 0.00E+00 | 4166.667 | 130.2083 |
| 976 | 61 | 20491.8 | 19979508 | 20020492 | 312179.8 | 312820.2 | 640.3689 | 0.00E+00 | 4098.361 | 128.0738 |
| 992 | 62 | 20161.29 | 19979839 | 20020161 | 312185 | 312815 | 630.0403 | 0.00E+00 | 4032.258 | 126.0081 |
| 1000 | 62.5 | 20000 | 19980000 | 20020000 | 312187.5 | 312812.5 | 625 | 0.00E+00 | 5000 | 156.25 |
| 1008 | 63 | 19841.27 | 19980159 | 20019841 | 312190 | 312810 | 620.0397 | 0.00E+00 | 4960.317 | 155.0099 |
| 1024 | 64 | 19531.25 | 19980469 | 20019531 | 312194.8 | 312805.2 | 610.3516 | 0.00E+00 | 4882.813 | 152.5879 |
| 1040 | 65 | 19230.77 | 19980769 | 20019231 | 312199.5 | 312800.5 | 600.9615 | 0.00E+00 | 4807.692 | 150.2404 |
| 1056 | 66 | 18939.39 | 19981061 | 20018939 | 312204.1 | 312795.9 | 591.8561 | 0.00E+00 | 4734.848 | 147.964 |
| 1072 | 67 | 18656.72 | 19981343 | 20018657 | 312208.5 | 312791.5 | 583.0224 | 0.00E+00 | 4664.179 | 145.7556 |
| 1088 | 68 | 18382.35 | 19981618 | 20018382 | 312212.8 | 312787.2 | 574.4485 | 0.00E+00 | 4595.588 | 143.6121 |
| 1104 | 69 | 18115.94 | 19981884 | 20018116 | 312216.9 | 312783.1 | 566.1232 | 0.00E+00 | 4528.986 | 141.5308 |
| 1120 | 70 | 17857.14 | 19982143 | 20017857 | 312221 | 312779 | 558.0357 | 0.00E+00 | 4464.286 | 139.5089 |
| 1136 | 71 | 17605.63 | 19982394 | 20017606 | 312224.9 | 312775.1 | 550.1761 | 0.00E+00 | 4401.408 | 137.544 |
| 1152 | 72 | 17361.11 | 19982639 | 20017361 | 312228.7 | 312771.3 | 542.5347 | 0.00E+00 | 4340.278 | 135.6337 |
| 1168 | 73 | 17123.29 | 19982877 | 20017123 | 312232.4 | 312767.6 | 535.1027 | 0.00E+00 | 4280.822 | 133.7757 |
| 1184 | 74 | 16891.89 | 19983108 | 20016892 | 312236.1 | 312763.9 | 527.8716 | 0.00E+00 | 4222.973 | 131.9679 |
| 1200 | 75 | 16666.67 | 19983333 | 20016667 | 312239.6 | 312760.4 | 520.8333 | 0.00E+00 | 4166.667 | 130.2083 |
| 1216 | 76 | 16447.37 | 19983553 | 20016447 | 312243 | 312757 | 513.9803 | 0.00E+00 | 4111.842 | 128.4951 |

FIG. 9C

Modulated Counter Chain Calculations f clock = 20,000,000 Hz.

| Divider | /16 | DRC | Clk-DRC | Clk+DRC | Mixer- | Mixer+ | Delta F | Delta Unit | PClk | Fmod |
|---|---|---|---|---|---|---|---|---|---|---|
| 1024 | 64 | 19531.25 | 19980469 | 20019531 | 312194.8 | 312805.2 | 610.3516 | 0.00E+00 | 4882.813 | 152.5879 |
| 960 | 60 | 20833.33 | 19979167 | 20020833 | 312174.5 | 312825.5 | 651.0417 | 0.00E+00 | 4166.667 | 130.2083 |
| 800 | 50 | 25000 | 19975000 | 20025000 | 312109.4 | 312890.6 | 781.25 | 0.00E+00 | 4166.667 | 130.2083 |
| 768 | 48 | 26041.67 | 19973958 | 20026042 | 312093.1 | 312906.9 | 813.8021 | 0.00E+00 | 4340.278 | 135.6337 |
| 640 | 40 | 31250 | 19968750 | 20031250 | 312011.7 | 312988.3 | 976.5625 | 0.00E+00 | 4464.286 | 139.5089 |
| 576 | 36 | 34722.22 | 19965278 | 20034722 | 311957.5 | 313042.5 | 1085.069 | 0.00E+00 | 4340.278 | 135.6337 |

FORMULAS USED IN FIGS 9A - 9C:

DIVIDER   = SELECTED WHOLE NUMBER WHICH PRODUCES A LINE WIDTH (DELTA F) OF 500 TO 1500 Hz.
/16       = DIVISION REMAINING TO YIELD THE DRC FREQUENCY AFTER THE DIVIDE BY 16.
DRC       = FCLK/DIVIDER.
CLK - DRC = FCLK - DRC
CLK + DRC = FCLK + DRC
MIXER -   = ("CLK - DRC")/64
MIXER +   = ("CLK + DRC")/64
DELTA F   = ("MIXER +") - ("MIXER -").
DELTA UNIT = RESULTING UNIT OFFSET FREQUENCY = [("MIXER +" - 312500) -(312500 - "MIXER -")]/[2*6.834 * 10^-9]
PCLC      = DRC/@ROUND(DRC/4480) NOTE: 4480 IS CHOSEN TO TARGET A 140 Hz FMOD FREQUENCY.
FMOD      = PCLK/32

NOTE: SINCE THERE ARE 2 TIME SLIPS PER EACH DRC CYCLE THE SUM OF WHICH EQUALS ONE INPUT CLOCK PERIOD THE ABOVE EQUATION IS EQUIVALENT TO THE EQUATION GIVEN IN THE TEXT.

FIG. 20

Pulse Swallow Synthesis Precision Frequency Control

Clock Freq = 2E+07 = (CLK)
Mix Divider = 64 = (MD) Normally for 312.5KHz
Increment>>> 1    0

| C/LAdj | LW | C/L Freq | Mod Depth | DivHigh | DivLow | DRCHigh | DRCLow | FHigh | FLow |
|---|---|---|---|---|---|---|---|---|---|
| 10 | 0 | 2.259E-10 | 621.91 | 1000 | 1010 | 20000.00 | 19801.98 | 312812.50 | 312190.59 |
| 9 | 0 | 2.035E-10 | 622.21 | 1000 | 1009 | 20000.00 | 19821.61 | 312812.50 | 312190.29 |
| 8 | 0 | 1.811E-10 | 622.52 | 1000 | 1008 | 20000.00 | 19841.27 | 312812.50 | 312189.98 |
| 7 | 0 | 1.586E-10 | 622.83 | 1000 | 1007 | 20000.00 | 19860.97 | 312812.50 | 312189.67 |
| 6 | 0 | 1.361E-10 | 623.14 | 1000 | 1006 | 20000.00 | 19880.72 | 312812.50 | 312189.36 |
| 5 | 0 | 1.135E-10 | 623.45 | 1000 | 1005 | 20000.00 | 19900.50 | 312812.50 | 312189.05 |
| 4 | 0 | 9.089E-11 | 623.75 | 1000 | 1004 | 20000.00 | 19920.32 | 312812.50 | 312188.75 |
| 3 | 0 | 6.823E-11 | 624.07 | 1000 | 1003 | 20000.00 | 19940.18 | 312812.50 | 312188.43 |
| 2 | 0 | 4.553E-11 | 624.38 | 1000 | 1002 | 20000.00 | 19960.08 | 312812.50 | 312188.12 |
| 1 | 0 | 2.279E-11 | 624.69 | 1000 | 1001 | 20000.00 | 19980.02 | 312812.50 | 312187.81 |
| 0 | 0 | 0.000E+00 | 625.00 | 1000 | 1000 | 20000.00 | 20000.00 | 312812.50 | 312187.50 |
| -1 | 0 | -2.284E-11 | 625.31 | 1000 | 999 | 20000.00 | 20020.02 | 312812.50 | 312187.19 |
| -2 | 0 | -4.572E-11 | 625.63 | 1000 | 998 | 20000.00 | 20040.08 | 312812.50 | 312186.87 |
| -3 | 0 | -6.864E-11 | 625.94 | 1000 | 997 | 20000.00 | 20060.18 | 312812.50 | 312186.56 |
| -4 | 0 | -9.162E-11 | 626.26 | 1000 | 996 | 20000.00 | 20080.32 | 312812.50 | 312186.24 |
| -5 | 0 | -1.146E-10 | 626.57 | 1000 | 995 | 20000.00 | 20100.50 | 312812.50 | 312185.93 |
| -6 | 0 | -1.377E-10 | 626.89 | 1000 | 994 | 20000.00 | 20120.72 | 312812.50 | 312185.61 |
| -7 | 0 | -1.608E-10 | 627.20 | 1000 | 993 | 20000.00 | 20140.99 | 312812.50 | 312185.30 |
| -8 | 0 | -1.840E-10 | 627.52 | 1000 | 992 | 20000.00 | 20161.29 | 312812.50 | 312184.98 |
| -9 | 0 | -2.072E-10 | 627.84 | 1000 | 991 | 20000.00 | 20181.63 | 312812.50 | 312184.66 |
| -10 | 0 | -2.304E-10 | 628.16 | 1000 | 990 | 20000.00 | 20202.02 | 312812.50 | 312184.34 |

DRCDivider: 1000

FIG.22

Modulated Counter Chain Calculations
Pulse Swallow Synthesis Precision Frequency Control

Clock Freq = 2E+07 = (CLK)
Mix Divider = 64 = (MD) Normally for 312.5KHz
Increment>>>  0

| C/LAdj | LW | C/L Freq | Mod Depth | DivHigh | DivLow | DRCHigh | DRCLow | FHigh | FLow |
|---|---|---|---|---|---|---|---|---|---|
| 750 | 0 | 9.777E-09 | 491.07 | 1000 | 1750 | 20000.00 | 11428.57 | 312812.50 | 312321.43 |
| 675 | 0 | 9.193E-09 | 499.07 | 1000 | 1675 | 20000.00 | 11940.30 | 312812.50 | 312313.43 |
| 600 | 0 | 8.555E-09 | 507.81 | 1000 | 1600 | 20000.00 | 12500.00 | 312812.50 | 312304.69 |
| 525 | 0 | 7.853E-09 | 517.42 | 1000 | 1525 | 20000.00 | 13114.75 | 312812.50 | 312295.08 |
| 450 | 0 | 7.080E-09 | 528.02 | 1000 | 1450 | 20000.00 | 13793.10 | 312812.50 | 312284.48 |
| 375 | 0 | 6.222E-09 | 539.77 | 1000 | 1375 | 20000.00 | 14545.45 | 312812.50 | 312272.73 |
| 300 | 0 | 5.264E-09 | 552.88 | 1000 | 1300 | 20000.00 | 15384.62 | 312812.50 | 312259.62 |
| 225 | 0 | 4.190E-09 | 567.60 | 1000 | 1225 | 20000.00 | 16326.53 | 312812.50 | 312244.90 |
| 150 | 0 | 2.976E-09 | 584.24 | 1000 | 1150 | 20000.00 | 17391.30 | 312812.50 | 312228.26 |
| 75 | 0 | 1.592E-09 | 603.20 | 1000 | 1075 | 20000.00 | 18604.65 | 312812.50 | 312209.30 |
| 0 | 0 | 0.000E+00 | 625.00 | 1000 | 1000 | 20000.00 | 20000.00 | 312812.50 | 312187.50 |
| -75 | 0 | -1.850E-09 | 650.34 | 1000 | 925 | 20000.00 | 21621.62 | 312812.50 | 312162.16 |
| -150 | 0 | -4.026E-09 | 680.15 | 1000 | 850 | 20000.00 | 23529.41 | 312812.50 | 312132.35 |
| -225 | 0 | -6.623E-09 | 715.73 | 1000 | 775 | 20000.00 | 25806.45 | 312812.50 | 312096.77 |
| -300 | 0 | -9.777E-09 | 758.93 | 1000 | 700 | 20000.00 | 28571.43 | 312812.50 | 312053.57 |
| -375 | 0 | -1.369E-08 | 812.50 | 1000 | 625 | 20000.00 | 32000.00 | 312812.50 | 312000.00 |
| -450 | 0 | -1.866E-08 | 880.68 | 1000 | 550 | 20000.00 | 36363.64 | 312812.50 | 311931.82 |
| -525 | 0 | -2.521E-08 | 970.39 | 1000 | 475 | 20000.00 | 42105.26 | 312812.50 | 311842.11 |
| -600 | 0 | -3.422E-08 | 1093.75 | 1000 | 400 | 20000.00 | 50000.00 | 312812.50 | 311718.75 |
| -675 | 0 | -4.738E-08 | 1274.04 | 1000 | 325 | 20000.00 | 61538.46 | 312812.50 | 311538.46 |
| -750 | 0 | -6.844E-08 | 1562.50 | 1000 | 250 | 20000.00 | 80000.00 | 312812.50 | 311250.00 |

DRCDivider = 1000

FIG. 24

Modulated Counter Chain Calculations
Pulse Swallow Synthesis Precision Frequency Control

Clock Freq = 2E+07 = (CLK)
Mix Divider = 64 = (MD) Normally for 312.5KHz
Increment>>> 16    75

| C/LAdj | LW | C/L Freq | Mod Depth | DivHigh | DivLow | DRCHigh | DRCLow | FHigh | FLow |
|---|---|---|---|---|---|---|---|---|---|
| 176 | 825 | -5.249E-08 | 1061.55 | 1825 | 351 | 10958.90 | 56980.06 | 312671.23 | 311609.69 |
| 160 | 750 | -4.260E-08 | 940.77 | 1750 | 410 | 11428.57 | 48780.49 | 312678.57 | 311737.80 |
| 144 | 675 | -3.502E-08 | 852.88 | 1675 | 469 | 11940.30 | 42643.92 | 312686.57 | 311833.69 |
| 128 | 600 | -2.895E-08 | 787.17 | 1600 | 528 | 12500.00 | 37878.79 | 312695.31 | 311908.14 |
| 112 | 525 | -2.390E-08 | 737.29 | 1525 | 587 | 13114.75 | 34071.55 | 312704.92 | 311967.63 |
| 96 | 450 | -1.958E-08 | 699.26 | 1450 | 646 | 13793.10 | 30959.75 | 312715.52 | 312016.25 |
| 80 | 375 | -1.577E-08 | 670.54 | 1375 | 705 | 14545.45 | 28368.79 | 312727.27 | 312056.74 |
| 64 | 300 | -1.231E-08 | 649.42 | 1300 | 764 | 15384.62 | 26178.01 | 312740.38 | 312090.97 |
| 48 | 225 | -9.096E-09 | 634.81 | 1225 | 823 | 16326.53 | 24301.34 | 312755.10 | 312120.29 |
| 32 | 150 | -6.028E-09 | 626.05 | 1150 | 882 | 17391.30 | 22675.74 | 312771.74 | 312145.69 |
| 16 | 75 | -3.022E-09 | 622.79 | 1075 | 941 | 18604.65 | 21253.99 | 312790.70 | 312167.91 |
| 0 | 0 | 0.000E+00 | 625.00 | 1000 | 1000 | 20000.00 | 20000.00 | 312812.50 | 312187.50 |
| -16 | -75 | 3.121E-09 | 632.93 | 925 | 1059 | 21621.62 | 18885.74 | 312837.84 | 312204.91 |
| -32 | -150 | 6.433E-09 | 647.16 | 850 | 1118 | 23529.41 | 17889.09 | 312867.65 | 312220.48 |
| -48 | -225 | 1.005E-08 | 668.73 | 775 | 1177 | 25806.45 | 16992.35 | 312903.23 | 312234.49 |
| -64 | -300 | 1.413E-08 | 699.26 | 700 | 1236 | 28571.43 | 16181.23 | 312946.43 | 312247.17 |
| -80 | -375 | 1.888E-08 | 741.31 | 625 | 1295 | 32000.00 | 15444.02 | 313000.00 | 312258.69 |
| -96 | -450 | 2.463E-08 | 798.98 | 550 | 1354 | 36363.64 | 14771.05 | 313068.18 | 312269.20 |
| -112 | -525 | 3.188E-08 | 879.06 | 475 | 1413 | 42105.26 | 14154.28 | 313157.89 | 312278.84 |
| -128 | -600 | 4.153E-08 | 993.55 | 400 | 1472 | 50000.00 | 13586.96 | 313281.25 | 312287.70 |
| -144 | -675 | 5.529E-08 | 1165.65 | 325 | 1531 | 61538.46 | 13063.36 | 313461.54 | 312295.89 |

DRCDivider 1000

DIGITAL FREQUENCY GENERATION IN ATOMIC FREQUENCY STANDARDS USING DIGITAL PHASE SHIFTING

This application claims the benefit of Provisional U.S. patent application Ser. No. 60/007,610 filed Nov. 22, 1995.

FIELD OF THE INVENTION

The present invention relates generally to atomic frequency standards, and to methods and apparatus for generating a standard frequency using the hyperfine transition frequency of a class of atoms to maintain a stable standard frequency, and, more particularly, to the generation of frequency-modulated components for the generation of frequency-modulated interrogation frequencies for interaction with atoms undergoing hyperfine transition in an atomic frequency standard, and includes methods and apparatus useable in the digital synthesis of pulse trains with variable rates of phase change for such use.

BACKGROUND ART

Atomic frequency standards generate and maintain a standard frequency output by using the transition between two well-defined energy levels of an atom and the associated precise transition frequency to control the frequency of a frequency generating means. The atomic transition between two energy levels is employed as a highly stable frequency reference to which the frequency of a variable frequency oscillator, such as a voltage controlled oscillator (VCO), can be electronically locked. The high stability and relative insensitivity to environmental perturbations associated with an atomic reference frequency is transferred to the variable frequency oscillator.

Hydrogen, cesium and rubidium frequency standards have been used to provide atomic controlled oscillators in which the generated standard frequency is usually 5 megahertz (5 MHz) or 10 MHz. Such frequency standards have usually employed a voltage controlled oscillator (frequently a quartz crystal oscillator, thus a voltage controlled crystal oscillator, or VCXO), a physics package and associated electronics in an effort to maintain an accurate and stable standard frequency on a long-term basis. The physics package and associated electronics have been used to slave the voltage controlled oscillator (VCO) to the frequency of the atomic transition, thereby reducing drifting due to aging and environmental effects. As well known in the art, the physics package includes a microwave resonator tuned to the atomic transition frequency, a closed transparent cell of atomic vapor in the microwave resonator, an atomic light source to excite atoms of the atomic vapor in the cell, means to inject microwave energy developed from the frequency of the voltage controlled oscillator into the microwave resonator of the physics package, and a photodiode to sense the intensity of light from the atomic light source that transits the atomic vapor.

In such atomic frequency standards, atoms in the physics package undergo hyperfine transition within a very narrow range of frequencies. For example, the hyperfine transition frequency, frequently referred to as the "atomic resonance frequency", of rubidium (Rb) gas is normally 6,834,687,500 Hz (6.834 ... GHz) and a typical physics package has an atomic bandwidth of about 700 to about 2000 Hz. In order to lock the voltage controlled oscillator to the atomic transition frequency with the physics package and to maintain a substantially unvarying standard frequency with the atomic transition frequency, a frequency-modulated microwave interrogation frequency is synthesized from the output frequency of the voltage controlled oscillator and is injected into the microwave cavity of the physics package. The atomic vapor within the transparent cell of the physics package is excited by incident light. The intensity of the light which is not absorbed in this excitation is sensed by a photodiode to provide a physics package electrical output signal. The energy of the frequency-modulated interrogation frequency injected into the microwave resonator of the physics package interacts with the atomic vapor within the physics package and varies the intensity of the light passing through the atomic vapor in a manner dependent upon the difference between the injected interrogation frequency and the atomic transition frequency, and the variation in light intensity is detected by the photodiode. The physics package thus provides frequency discrimination with an electrical signal output that can be used to control the frequency of the voltage controlled oscillator.

Thus, frequency modulation of an interrogation carrier frequency, within the atomic bandwidth of the hyperfine transition frequency, is used to determine if the interrogation carrier frequency (which is a function of the standard frequency) is higher or lower than the hyperfine transition frequency to generate a corrective signal to correct the frequency of the voltage controlled oscillator and to lock it to the hyperfine transition frequency.

The standard output frequency of atomic frequency standards is generally either 10 MHz or 5 MHz (although other frequencies can be provided). Since 5 MHz and 10 MHz are not integral submultiples of an atomic resonance frequency (e.g. 6.834 ... GHz for Rb), the generation or synthesis of a frequency-modulated interrogation frequency is not straightforward. Two techniques are commonly used to up-convert a VCO output frequency to the microwave interrogation frequency.

One approach, commercially available, is a direct conversion generating a VCO output frequency at a non-standard value which is an integral submultiple of the atomic resonance frequency (for example, 50.255 MHz* 136 is 6,834 ... GHz). In such implementations, the VCO output frequency is converted by a synthesizer to a standard value frequency (e.g., 5 MHz or 10 MHz) if the non-standard output frequency is not acceptable. The output spectrum of the synthesizer is cleaned up by a low pass or band pass filter (a crystal filter is preferable). That is, energy at unwanted frequencies, referred to as "frequency spurs" are filtered from the output.

The advantages of this approach are an inherently cleaner physics microwave spectrum with more physics discriminator gain achievable for the same injected microwave power, ready support of remote digital fine frequency control, and flexibility in providing non-standard output frequencies. The physics package operation is untouched by the synthesis with acceptable non-standard frequency outputs, although the output crystal filter is expensive and needs changing for each non-standard output frequency. The disadvantages of this approach is in its cost and in the frequency spurs generated by the synthesizer; the energy of the frequency spurs is inherently high in value and expensive to remove by filtering, and the frequency spur patterns will change from unit-unit and for each frequency change.

A second approach utilizes a VCO output frequency at a standard value, and a multiplier/synthesizer apparatus to convert the output frequency to the atomic resonance frequency for injection into the physics package. Many Rb atomic frequency standards use this approach. A synthesizer is used to generate the non-integer portion of the overall multiplication factor, and a multiplier is used to generate the integer portion of the atomic resonance frequency, and the resulting outputs are mixed and multiplied. (For example, using a generated clock frequency of 20 MHz [fCLK=20 MHz] and after mixing the multiplier and synthesizer signals together, {6.834 . . . GHz=fCLK*[342+1*17/64]}, so the multiplier factor would be 342 and the synthesizer factor would be 17/64). Frequency modulation can be accomplished in either the synthesizer or multiplier portion of the interrogation frequency generation path. Normally, the synthesizer frequency output is unmodulated, and, often, the multiplier frequency is frequency-modulated.

Digital synthesis of frequency-modulated interrogation frequencies is known. In one such known modulated digital synthesis, called "binary frequency shift keyed modulation", the synthesis portion of the interrogation frequency is digitally stepped (at a rate of the modulation frequency, fmod) between two frequencies offset (Fdev) equally, or nearly equally, above and below the desired component of the interrogation frequency (such as 5.3125 MHz±Fdev). The frequency stepping is preferably accomplished about a lower clock sub-harmonic frequency, such as 312.5 kHz (312.5 kHz±Fdev), and mixed (for example, with exclusive OR gates) with a higher clock sub-harmonic frequency, such as 5 MHz, to obtain the necessary modulated interrogation frequency component. The step rate fmod (modulation frequency) is normally much lower than the mixer input frequencies.

One way to get the 5.3125 MHz uses a two input "EXCLUSIVE OR" gate with 5 MHz on one input and 312.5 kHz on the other input. Both of these frequencies are easily achieved with counters from the 20 MHz. The output of such an exclusive OR mixer includes the spectral components of the first frequency input, plus and minus the spectral components of the second frequency input (plus and minus the spectral components of any third frequency input, if used).

There are only a limited number of binary number combinations available to divide down digitally from an input clock of, for example, 20 MHz to yield two mixer input frequencies to give 5.3125 MHz. One of these two frequencies is 5 MHz (20 MHz÷4) and the other is 312.5 kHz (20 MHz÷64).

One method of providing step frequency modulation is to switch between two counter integer values at an fmod rate. The physics package discriminator gain generally peaks when the modulation depth (2 Fdev) equals the atomic bandwidth and drops rapidly beyond this range, and little performance is achieved when the modulation depth is even twice that of the atomic bandwidth.

Significant frequency offsets (the differences between the absolute values of +Fdev and −Fdev of the modulated interrogation frequency must be avoided. In order to avoid significant frequency offsets, the two counter values should be [+(R+1)] and [+(R−1I)], and R should be large, where R is the division factor of the counters. The modulation depth is unacceptably high for low values of R. If the stepping is accomplished to obtain 5 MHz then R=4, and if stepping is accomplished to obtain 312.5 kHz than R=64; both values of R are too low. For example, if the 312.5 kHz (20 MHz÷64) is incrementally stepped by alternating its division factor R to 64±1 (e.g., alternating division factors of 63 and 65), the result is a modulation depth of {20 MHz×(1/63−1/65)}, or 9768 Hz, which is far higher than the desired goal of using no more than approximately the atomic bandwidth, which is typically between 700 Hz to 2000 Hz. For the same example, the frequency offset is {20 MHz×[(1/63−1/64)−(1/64−1/65)]/2} or 76.3 Hz, or an offset factor of $1.1\times10^{-8}$, which is far greater than the correction range available from a C-field correction. The offset factor is the difference between the absolute values of +Fdev and −Fdev of the modulated interrogation frequency divided by 2, divided by the atomic resonance frequency, e.g., 76.3 Hz÷6.834 GHz, or $1.1\times10^{-8}$. An offset factor of less than $1\times10^{-9}$ can comfortably be nulled with the C-field current adjustment, which is an adjustment in the current through a coil wound around the resonance cell that can provide small frequency adjustments from the magnetic field sensitivity of the atomic transition frequency of the reference gas.

The above equations for modulation depth and frequency offset can have "R" inserted in place of the 63, 64 and 65, respectively and can be simplified to yield the following more general equations: modulation depth (Fdev)=2*fclk, $1/(R^2-1)$=for a 20 MHz clock, 40 MHz/$(R^2-1)$ frequency offset=fclk/[R*$(R^2-1)$]=20 MHz/[R*$(R^2-1)$]

The modulation depth, or resolution, of Fdev approximately improves as a function of R squared but this requires a lower mixer frequency into the exclusive OR. The frequency offset approximately improves as a function of R cubed which again requires a lower mixer frequency into the exclusive OR. The goal, however, is to avoid false lock spurs and Zeeman interactions that can occur if the mixer frequencies are too low, and to have less than a 7 Hz frequency offset at 312.5 kHz, which would provide an offset factor of $\sim1\times10^{-9}$ at the microwave frequency of ~6.84 . . . GHz.

The difficulty of inadequate resolution due to small divider ratios can be skirted by using three inputs to the exclusive OR mixer, such as 5 MHz, 104.166 kHz, and 208.333 kHz, and varying the count of the lowest frequency counter chain (104.166 kHz) to obtain modulation. Although this approach can give an acceptable modulation index, if properly implemented, the resulting 208.333 kHz sideband spurs on the output are difficult to filter out to prevent Zeeman interactions, and if left in the spectrum, they can excite unwanted and interfering hyperfine transitions that are not magnetic field independent to first order. One other side effect of using three inputs is that the number of sidebands generated increases, reducing the signal strength on the desired frequency.

An exclusive OR gate essentially multiplies one input by ±1 at the frequency and duty cycle of the other input, in effect, one input inverts the other. If both inputs are square waves then the even harmonics are largely suppressed in each waveform and only the odd harmonics (N) are left to be multiplied by each other. The harmonic amplitudes decay by a 1/N relationship. When two frequencies are multiplied together, each individual frequency is suppressed and the sum and difference frequencies are present at one-half the amplitude.

An ideal exclusive OR gate used as a mixer with 50 percent duty cycle pulse train (square wave) inputs F1 and F2, provides all combinations of the sums and differences of the odd harmonics (N and M) of each input. The two input frequencies themselves tend to be suppressed.

The magnitude of each of these output frequencies for a 5 V logic exclusive OR gate is roughly {1.43 VRMS/(N*M)}; this is derived from [[Peak Value of fundamental component of 5 Vpeak-peak squarewave] times [Peak Value of fundamental component of 1 Vpeak squarewave] times [Conversion Factor of ½×0.707]} or {3.183 V×1.273 V×0.5×0.707}.

Using 5 MHz and 312.5 kHz as inputs, the sum of each frequency yields 5.3125 MHz with the nearest sidebands being 2*312.5 kHz or 625 kHz away. The first lower sideband 4.6875 MHz (5 MHz–1*312.5 kHz) should be of the same magnitude as the 5.3125 MHz (5 MHz+1*312.5 kHz), and the first upper sideband 5.9375 MHz (5 MHz+ 3*312.5 kHz) should be ~9.5 dB lower in magnitude. Note that there will be another cluster of spurs about 15 Mhz (the third harmonic of 5 MHz), but each corresponding spur of this cluster will be (1/N)=⅓, or roughly 9.5 dB lower than that obtained from the cluster about 5 MHz, so these can be ignored.

The use of a modulated square wave input signal (at a frequency f) to an exclusive OR mixer will generate modulated outputs at the odd harmonics of f. These harmonics will show up at the microwave resonator of the physics package due to the mixing and frequency multiplication action of the step recovery diode (SRD) multiplier (generating I*$f_{MULT}$+ J*$f_{SYNTH}$ components, where I is a positive integer and J is an integer). Nominally the J=–1 harmonic of the synthesizer frequency is selected for atomic standard operation (at 6.834 ... GHz for rubidium standards). However, the control loop cannot tell which of the modulation frequency harmonics that the microwave system is locked onto. The first harmonic frequency of the modulated input from the synthesized output frequency to the physic package is the desired frequency. The second harmonic frequency of the modulated input to the physics package does not generate a lockable signal strengths, provided the exclusive OR mixer input is a square wave (thus suppressing even harmonics). The third harmonic of the modulated input to the physics package from the synthesized output frequency can give a false lock when within the capture range of the VCO. To prevent locking onto one of these false third harmonic frequencies, the spur frequencies can be kept greater than the capture range of the VCO (i.e., twice the adjustment range of the VCO plus the over sweep of the crystal); however, this criteria actually can result in an inferior modulation depth that degrades the short term stability performance of the atomic frequency standard significantly. Over 30 percent degradation has been observed when using a modulation depth (2 Fdev) roughly 25 to 30 percent larger than the atomic bandwidth, depending upon the physics package and the variable frequency source in use.

The actual modulation frequencies selected for a unit ideally should provide an optimum modulation depth (2 Fdev) for the physics package used in the atomic frequency standard, and should satisfy the need to prevent frequency harmonics providing false locking frequencies. As indicated above, the depth of modulation of the interrogation frequency carrier is ideally on the order of the atomic bandwidth for the physics package used.

Time & Frequency Ltd. has implemented and published the use of binary frequency shift-keyed modulation in a rubidium atomic frequency standard, E. Detomz, G. Pedrotto, et al., *High Resolution Digital Synthesizer For A Rb Frequency Standard*, Proceedings of the 6th European Frequency and Time Forum, held at ESTEC, Noordwijk, NL, Mar. 17–19, 1992, pp. 457–469. This described system implemented the synthesizer with a more complicated fractional frequency synthesizer (FFS) with a 312.5 kHz phase-locked-loop. The FFS output frequency was set to a nominal 20.8 kHz, which could be varied for fine frequency control, and was mixed via a phase detector with a filtered signal from a second mixer output that included a 333.3 kHz signal (10 MHz clock+30) and the 312.5 kHz PLL output. Finally, a third mixer was used to combine 5 MHz (10 MHz clock+2) and the PLL output signal of 312.5 kHz (suitably corrected for the fine frequency control commands to the FFS) to obtain 5.3125 MHz. A third filter is not shown between the 5.3125 MHz signal and the SRD multiplier.

Binary frequency modulation is accomplished in this approach by modulating the FFS output frequency between two frequencies at a rate of 80 Hz. The authors refer to the need to use a track-and-hold circuit between the synchronous detector and the integrator to allow for the decay of roughly 1 msec. in the energy stored in the atomic resonator.

In the prior art, digital frequency synthesis has been accomplished with "pulse swallowing" phase-locked-loops (PLL), as shown in FIG. 1. The disclosed implementation used a counter that switches between +N and +(N +1). The counter switches to +(N+1) only for one cycle of the counter and then back to +N for a number of cycles determined by a second counter A. This duty cycling of the value N in effect creates a time slip of one clock pulse ("pulse swallowing") at a rate determined by the second counter A. This yields better resolution in the output frequency setting than by simply changing the value of N by one without duty cycling it.

The disclosed "pulse swallowing" PPL yields a periodic phase error which repeats at the rate of counter A. The phase-locked-loop (PLL) bandwidth is normally set much less than the counting frequency to counter A. This alone will filter the frequency sidebands of counter A to some extent, but filtering can be greatly improved byhaving a multiple pole low pass filter after the phase detector which has a corner frequency beyond the PLL bandwidth (for loop stability) and well below the frequency of counter A to attenuate the counter A frequency feedthrough to the control voltage for the crystal. The filtering described is, in effect, a resolution bandwidth filter that reduces significantly the short term frequency impulses resulting from the "pulse swallowing", leaving the average frequency.

SUMMARY OF THE INVENTION

The invention permits the generation of frequency-modulated interrogation frequencies in which the modulation characteristics can be tailored to the frequency discrimination characteristics of a physics package. The invention provides methods and apparatus for varying the rate of phase change of a digital pulse train providing a frequency-modulated component of interrogation frequency for an atomic frequency standard. Such methods and apparatus include multiplexing a plurality of differently phased (delayed) pulse trains to vary the rate of phase change in a digital interrogation frequency component, and effecting phase delays and phase advances of a digital interrogation frequency component.

The invention provides improved digital means for synchronously synthesizing, from an output clock frequency of a controllable frequency source, a plurality of integrally-related submultiple frequencies of said clock frequency and an integrally-related modulation frequency, one of said plurality of integrally-related submultiple frequencies being frequency-modulated by changing its phase at said integrally-related modulation frequency, and means for digitally mixing at least one of said plurality of integrally-related submultiple frequencies and said frequency-modulated submultiple frequency, in synthesizing said digital, frequency-modulated interrogation signal.

In the invention, a frequency-modulated interrogation frequency is generated by varying the rate of phase change of a digital frequency component of the interrogation frequency during alternate half cycles of the modulation frequency, preferably by adding phase shift to a modulatable submultiple of the clock frequency as the interrogation frequency component during one half-cycle of the modulation frequency, and subtracting phase shift from the modulatable submultiple of the clock frequency as the interrogation frequency component during the other half-cycle of the modulation frequency, with a preferable cancellation of the positive and negative phase shifts over one cycle of the modulation frequency (i.e., a resulting net zero phase shift over each cycle of the modulation frequency). Preferred methods and apparatus of the invention vary the rate of phase change in frequency modulating a digital frequency component of an interrogation frequency by generating from a clock frequency, a plurality of differently phased pulse trains of the digital frequency component of the interrogation frequency, and multiplexing the plurality of differently phased pulse trains during alternate half-cycles of the modulation frequency to provide, for generation of the interrogation frequency, a frequency-modulated pulse train output with varied rates of phase change during alternate half-cycles of the modulation frequency.

Other methods and apparatus of the invention include introducing phase delay and phase advance by frequency shift keyed modulation, such as frequency modulation by adding and removing ("swallowing") pulses from a modulatable submultiple of the clock frequency in the synthesis of a frequency-modulated interrogation frequency. Such a frequency modulation, for example, can vary the phase of a digital frequency component of a synthesized frequency-modulated interrogation frequency by, during alternate half-cycles of a synchronous modulation frequency and at a synchronous phase change frequency, adding pulses to and subtracting pulses from a modulatable frequency pulse train applied to an exclusive OR mixer.

Another feature of the invention is the ability to effect fine frequency and/or modulation depth control which can overcome physics package frequency offsets, potentially minimizing the expense of adjusting the physics package frequency during manufacturing. In the invention, increments of phase can be added to and/or subtracted from a digital frequency component of the interrogation frequency at a variable phase change frequency (or drop rate count –DRC) to provide variable rates of phase change in alternate half-cycles of the modulation frequency in the synthesis of a frequency-modulated interrogation signal. Fine frequency control in the interrogation signal can be effected, without changing modulation depth, by alternating the phase change frequency (DRC) by a positive incremental frequency (+αf) during first half-cycles of the modulation frequency and by altering the phase change frequency (DRC) by a negative incremental frequency (–αf) during the opposite half-cycles of the modulation frequency. Modulation depth control can be effected, without changing the frequency offset, by altering the phase change frequency (DRC) by a positive incremental frequency (+αf) during both half-cycles of the modulation frequency.

Other features and advantages of the invention will be apparent from the drawings and more detailed description of the invention that follows.

BRIEF DESCRIPTION OF THE DRAWINGS

FIG. 5 illustrates the idealized outputs of the synthesizer frequency for the two levels of the frequency modulation signal;

FIG. 6 is a diagram of the phase deviation with respect to time for a fixed frequency offset (Fdev);

FIG. 8 is a diagram to illustrate the filtering action required from the physics package for the spectrum obtained with pulse swallow components;

FIG. 9A and 9B represent a series of acceptable divider/ frequency combinations that may be used with the invention;

FIG. 9C represents the divider/frequency combinations of FIGS. 9A and 9B that are most readily obtained and thus preferred;

FIGS. 19–24 demonstrate the frequency control capability of the invention.

DETAILED DESCRIPTION OF THE BEST MODE OF THE INVENTION

Figure 1:
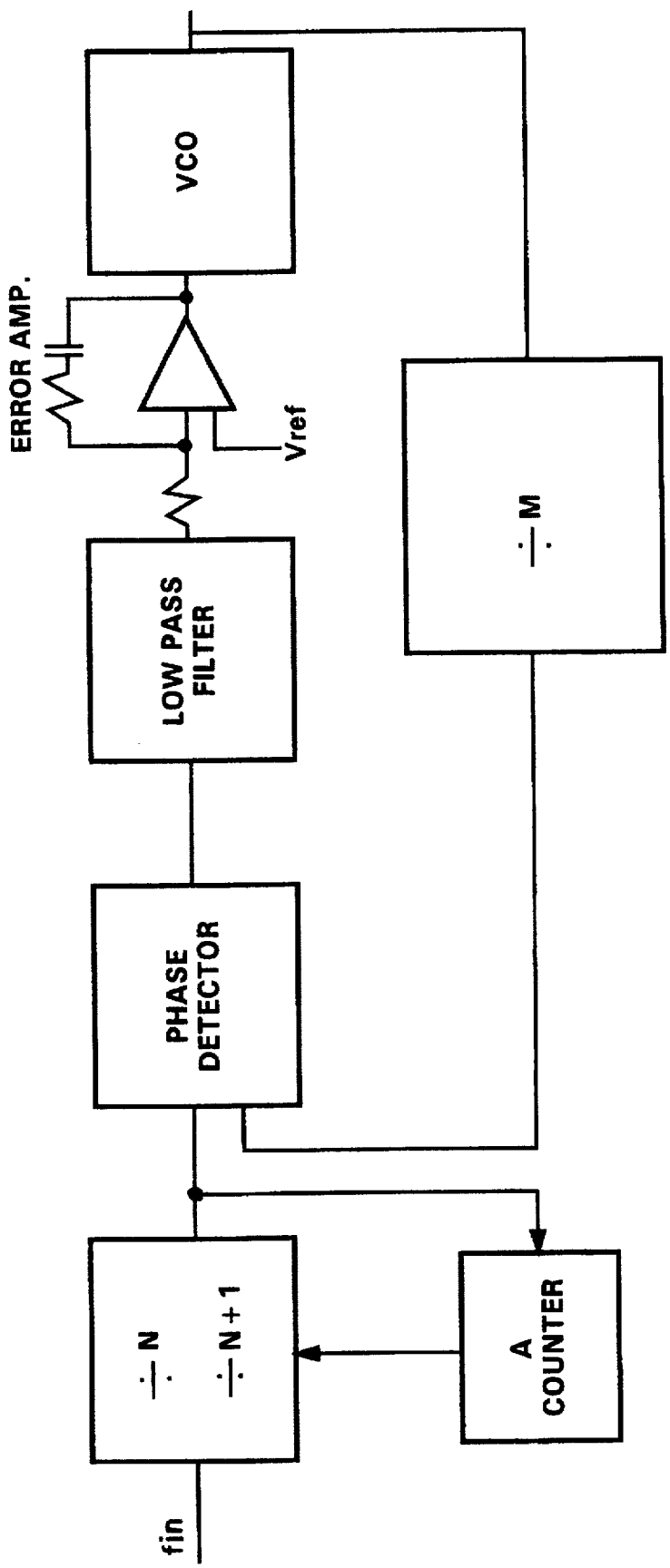
FIG. 1 is a block diagram of a prior art phase-lock loop (PLL), pulse swallowing circuit.
Figure 2:
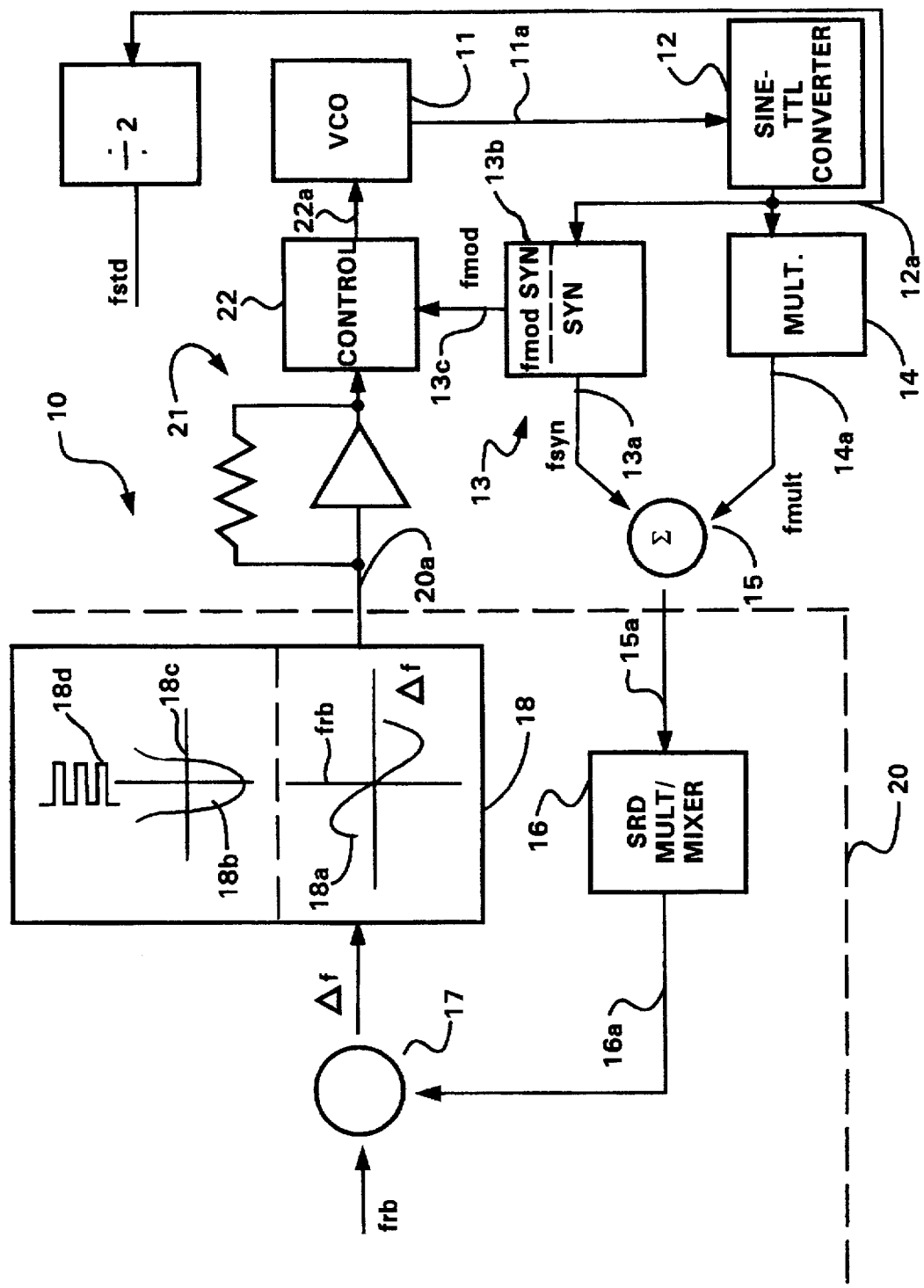
FIG. 2 is a simplified block diagram of one atomic frequency standard in which the invention can be used.

FIG. 2 is a simplified block diagram of an atomic frequency standard 10 in which the invention can be incorporated. Such an atomic frequency standard includes a controllable frequency source 11, such as a voltage controlled oscillator (VCO), or voltage control crystal oscillator (VCXO), for generating a standard frequency such as 10 MHz, but in this described preferred embodiment the controllable frequency source generates a source output, or clock, frequency of 20 MHz which is divided by two to provide a "standard" 10 MHz frequency output. The frequency generated by the controllable frequency source 11 is, as well know in the art, locked to the atomic transition frequency of an atomic gas such as rubidium gas which has an atomic transition frequency of 6.834 . . . GHZ.

In the operation of the atomic frequency standard 10 the output 11a of the controllable frequency source 11 is connected with means 12 for forming output 11a into a digital pulse train 12a with pulses at a frequency of 20 MHz. The pulse train 12a is applied to a frequency synthesizer 13 of the invention and a multiplier 14. The output 13a of the frequency synthesizer is, preferably, for a rubidium standard, 5.3125 MHz which is generated and frequency-modulated digitally, as described below in greater detail. The output of the controlled frequency source 11, after conversion to pulse train 12a, is multiplied in multiplier 14 in a manner well known in the art (for example, by a whole number Z to provide $Z \times f_{CLOCK}$). The output 14a of the multiplier is summed with the output 13a of the digital frequency synthesizer 13 in a summing circuit 15. As known in the art, matching circuits (not shown) may be used between the outputs of the frequency synthesizer 13 and the multiplier 14 and summing circuit 15. The output 15a of the summing circuit is connected with an SRD multiplier/mixer 16 in a physics package 20. The output of SRD multiplier/mixer is injected into the microwave cavity, diagrammatically shown as 17 and 18, of the physics package 20 where it interacts with the atoms of an excited atomic gas. Where the atomic gas is rubidium, the output 16a of SRD multiplier mixer 16 is a digitally-formatted, frequency-modulated, interrogation frequency of 6.834 . . . GHz, which is the atomic transition frequency (atomic resonance frequency, fRB) of rubidium when the output of the controllable frequency source 11 is at the standard frequency.

The physics package 20 acts as a frequency discriminator, diagrammatically shown in 17 and 18 of FIG. 2, and produces a photodiode electrical output signal which is a function of the difference between the microwave interrogation signal frequency and the atomic transition frequency of the atomic gas. The relationship of the photodiode signal output amplitude and phase to frequency difference is illustrated as 18a. The derivation of the signal output amplitude to frequency difference is illustrated as 18b. The 18a and 18b illustrations are exaggerated for purposes of illustration and explanation and are not to any scale.

If the interrogation frequency is, for example, less than the atomic transition frequency of the atomic gas, fRB, the photodiode of the physics package will provide an electrical output signal at the modulation frequency having one phase. If, however, the interrogation frequency is greater than the atomic transition frequency of the atomic gas, the photodetector of the physics package will provide an electrical signal at the modulation frequency which is 180° out of phase with its output frequency when the interrogation frequency is less than the atomic transition frequency. When the interrogation frequency is equal to the atomic resonance frequency, the photodiode provides an output signal at twice the modulation frequency.

As illustrated by 18b, the physics package has an output signal amplitude characteristic centered on the atomic resonance frequency ($f_{RB}$) with an atomic bandwidth that is very narrow, for example, about 800 to about 2000 Hz. In some practical physics packages of commercial rubidium atomic frequency standards the output signal amplitude characteristic 18b has a maximum slope and therefore provides a maximum change in the output signal for changing frequency at about ±400 Hz from the atomic resonance frequency (indicated by line 18c). In such standards, frequency modulation depth 2 Fdev (indicated by 18d) of about 600 Hz to 1200 Hz, and preferably about 800 Hz, can change the signal output by as much as 30 percent. The synthesis of frequency-modulated interrogation signals with such optimal modulation depths can, however, provide false lock possibilities.

Thus, the output of physics package 20 provides different signals when the interrogation frequency is below, above and at the atomic resonance frequency, which are used to adjust the controllable frequency source 11 and lock it to the atomic transition frequency of the atomic gas.

As shown in FIG. 2, the photodetector current output signal 20a of the physics package 20 is converted to a voltage in a pre-amp 21 and the voltage output is connected with a servo control circuit 22 which amplifies, signal conditions and demodulates the electrical signal and develops a control signal 22a for the controllable frequency source 11 which adjusts the frequency of the controllable frequency source 11 toward the atomic transition frequency when the atomic frequency standard 10 is first turned on and thereafter maintains the frequency of the controllable frequency source 11 at the standard frequency, or a multiple or submultiple of the standard frequency, during its operation.

The digital frequency synthesizer 13 comprises a digital means 13b for generating a digitally-formatted modulation frequency which is used in the digital synthesizer 13 to synthesize a digitally-formatted frequency-modulated interrogation signal component 13a. The digitally-formatted modulation frequency 13c is also connected with servo control circuit 22 for demodulation of the amplified electrical signal output of physics package 20.

Throughout the description of the invention and its references to various frequencies, it should be understood that we are referring to a series of digital pulses occurring at a rate equal to the frequency, each frequency cycle of said digital pulse train being characterized by a "high" state followed by a "low" state (i.e., a "1" and a "0"). In the digital frequencies, first, or one, half-cycles will be represented by one of the states (e.g., the "high", or "1" state) and the other or opposite half-cycles will be represented by the other state (e.g., the "low" or "0" state).

Figure 3:
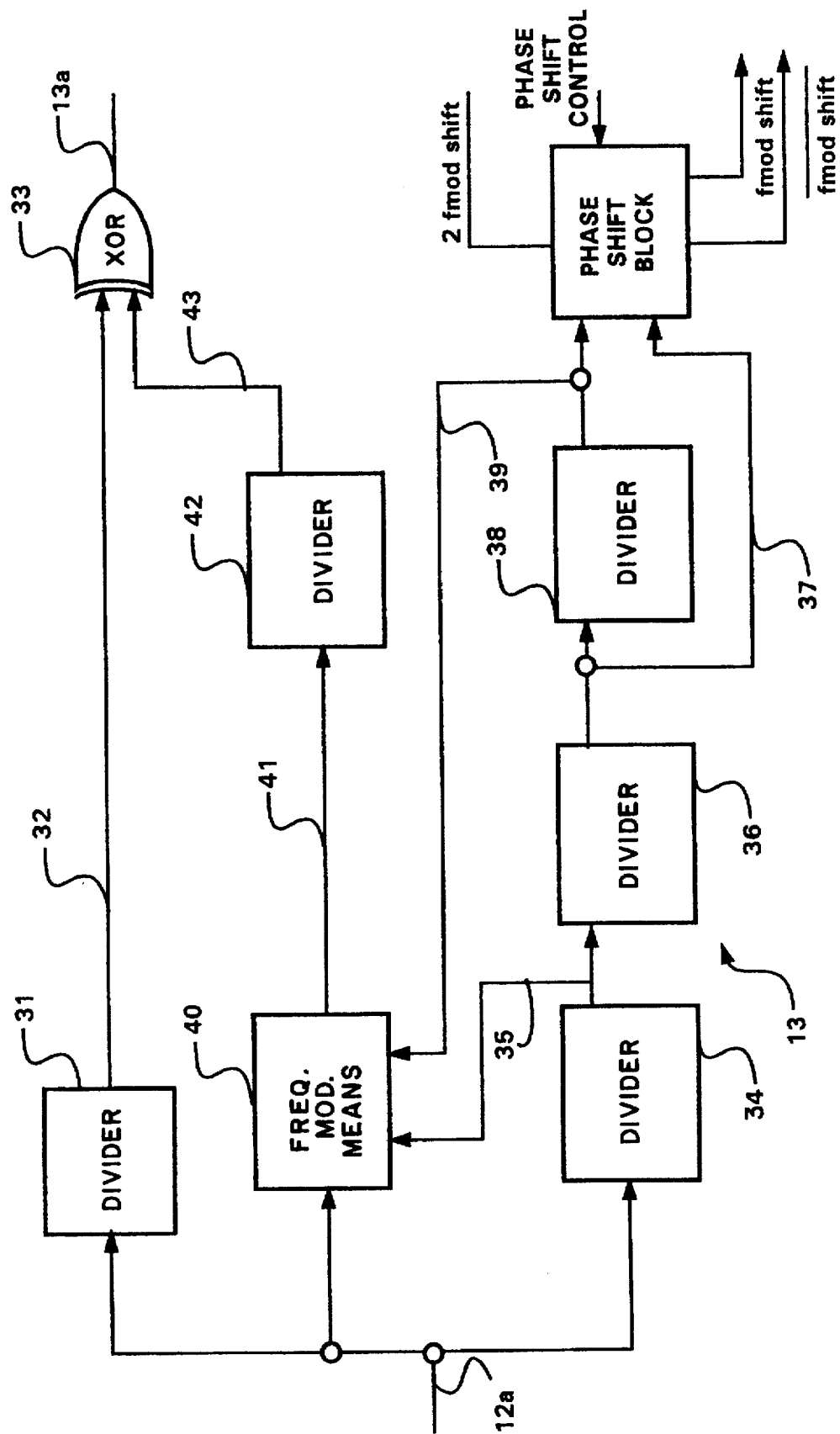
FIG. 3 is a block diagram of a frequency synthesizer of the invention.

FIG. 3 is a block diagram of a digital frequency synthesizer 13 of the invention. In the digital frequency synthesizer 13, a pulse train at the clock frequency 12a, preferably 20 MHz, is divided by a first counter/divider 31, which preferably divides the clock frequency by 4, to obtain one submultiple of the clock frequency 32, preferably 5 MHz, for an input to an exclusive OR mixer 33. The clock frequency 12a is also divided by a second counter/divider 34 to provide a synchronous phase change frequency (or drop rate count, DRC) 35. The phase change frequency (DRC) 35 is further divided by a third counter 36 to provide a frequency 37 twice the modulation frequency (2 fmod), which is divided by fourth counter 38 to provide a synchronous modulation frequency (fmod) 39.

The frequency synthesizer 13 includes frequency modulation means 40 for varying the phase of the clock frequency, or a frequency modulatable submultiple of the clock frequency at one or more phase change frequencies (DRC) 35 during alternate half-cycles of the modulation frequency (fmod) 39. As set forth in further detail below, frequency modulation means 40 preferably adds phase shift (provides positive phase shift) during one half-cycle of the modulation frequency 39 and subtracts phase shift (provides negative phase shift) during the other half-cycle of the modulation frequency 39, but the invention permits phase shift to be added, subtracted, or added and subtracted at different, and at varied phase change frequencies (DRCs) for control of frequency offsets and modulation depth.

The "phase change frequency" (DRC) is the frequency or rate at which phase changes are introduced into a modulatable frequency that is used in the synthesis of a frequency-modulated interrogation frequency. A modulatable frequency (sometimes referred to for convenience as the "alpha frequency") is a frequency that is high enough to permit a phase change frequency (DRC) that is many times greater than twice the modulation frequency (DRC >>2 fmod) to permit a great many increments of phase to be added during each half-cycle of the modulation frequency and to permit the phase increments to be small by use of very short duration pulses, all as explained in greater detail below.

In digital embodiments of this invention, increments of phase can be added to, and subtracted from, a modulatable frequency at a phase change frequency (DRC), or rate of phase change, that can be constant or can be varied to yield fine frequency control and/or varied modulation depth of the interrogation frequency. For example, in digital methods and apparatus of the invention, increments of phase can be added to a modulatable frequency at a first phase change frequency (DRCH) during one half-cycle of modulation of the interrogation frequency and can be subtracted from a modulation frequency at a second phase change frequency (DRCL) during the other half-cycle of modulation of the interrogation frequency. In the invention, both the modulatable frequency and the phase change frequency are selectable to effect improved control of modulation depth and fine frequency control to overcome physics package offsets and the adjustments of the physics package frequency during manufacturing.

The output 41 of frequency modulation means 40 is a frequency-modulated pulse train centered at the modulatable frequency, which is divided by a fifth divider/counter 42 to provide a frequency-modulated (phase-varied) input frequency 43, preferably centered on 312.5 kHz, as a second input to the exclusive OR mixer 33. The output 13a of the exclusive OR mixer 33 is the digitally synthesized frequency-modulated (phase-varied) submultiple of the clock frequency which is combined with output of multiplier 14 (See FIG. 2) to provide the digitally synthesized, frequency-modulated interrogation signal 15a.

A frequency modulation means 40 of the invention can employ anyone of several means for digitally varying the rate of phase change of a modulatable frequency on alternate half-cycles of a modulation frequency, e.g., by adding phase increments to and subtracting phase increments from a pulse train. One such digital frequency modulation means 40 and its operation, which adds and swallows, or subtracts, pulses from a modulatable frequency pulse train, is illustrated in FIGS. 4A and 4B.

Figure 4A:
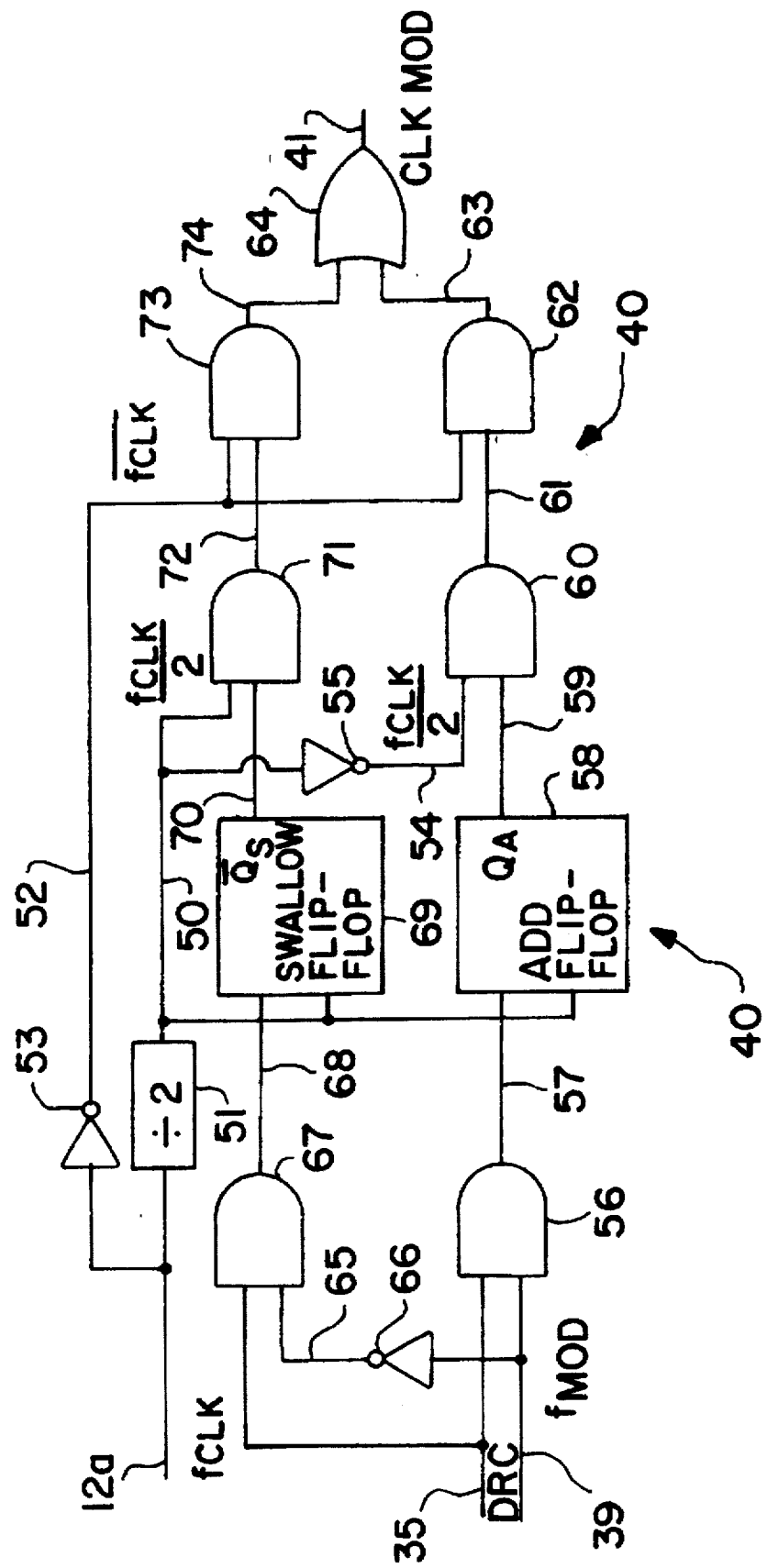
FIG. 4A and 4B illustrate one frequency modulation means of the invention and its operation.
Figure 4B:
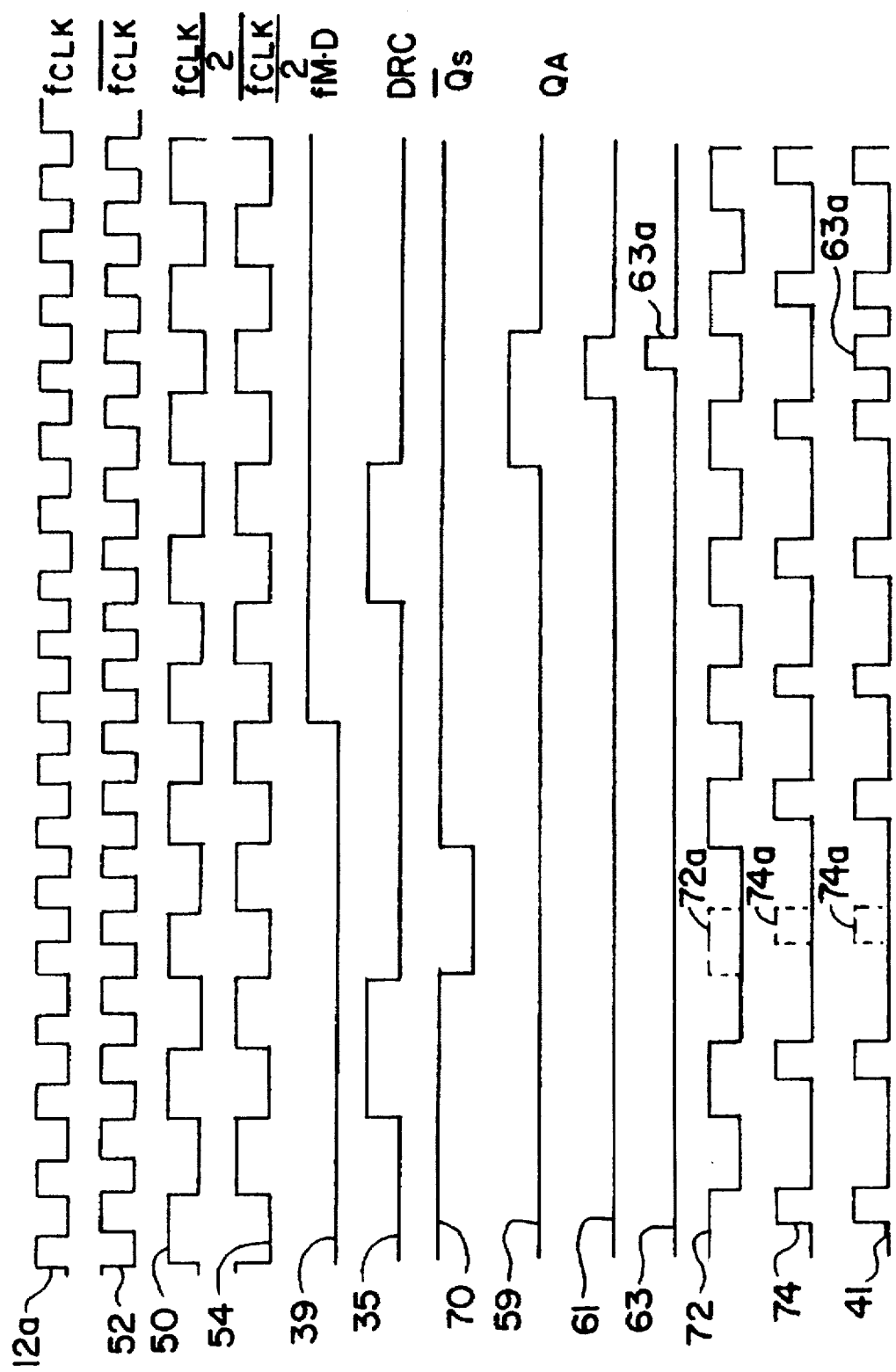

In the frequency modulation means 40 of FIGS. 4A and 4B a modulatable frequency (fCLK/2) 50 is generated by dividing the clock frequency 12a with a divide-by-2 counter 51, and an inverted clock frequency pulse train 52 is generated by an inverter 53. An inversion 54 of the modulatable frequency 50 (fCLK/2) is created by a second inverter 55.

A phase change pulse train (DRC) 35 and a modulation frequency pulse train (fmod) 39 are combined by an AND circuit 56 to generate a signal 57 that triggers an addition flip-flop 58, which generates an add pulse (QA) 59 for a time equal to one cycle of the modulatable frequency (fCLK/2) 50. As shown in FIGS. 4A and 4B, the coincidence of the add signal pulse (QA) 59 and the inverted modulatable frequency pulse train 54 at a second AND circuit 60 provides a single pulse 61 with a pulse width equal to one half-cycle of the modulatable frequency 50 as one input to a third AND circuit 62. The other input of the third AND circuit 62 is the inverted clock frequency pulse train 52, and the coincidence of the single pulse 61 and the inverted clock frequency 52 at the inputs to the third AND circuit 62 generates a single pulse output 63a which has a pulse duration equal to one half-cycle of the clock frequency 12a. In the frequency modulation means 40, a series of such single "add" pulses 63a are generated at the phase change frequency (DRC) 35 during one half-cycle of the modulation frequency 39, that is, the add pulse 63a is applied as one input of OR circuit 64 following each pulse of the phase change frequency pulse train (DRC) 35 during the half-cycles of the modulation frequency 39 when its pulses are high.

In the generation of pulse subtraction, an inversion 65 of the modulation frequency 39 is generated by an inverter 66 and is combined with the pulse change frequency (DRC) 35 by a fourth AND circuit 67 to generate a signal 68 to trigger a swallow flip-flop 69 to disable its output 70 for a time equal to one cycle of the modulatable frequency (fCLK/2) 50. As shown in FIGS. 4A and 4B the modulatable frequency pulse train 50 and the output 70 of the swallow flip-flop are applied as inputs to a fifth AND circuit 71, which provides a pulse train output 72, except during the cycle of the modulatable frequency when output 70 is disabled thus removing pulse 72a. The pulse train 72 is applied as one input to a sixth AND circuit 73, and the inverted clock frequency 52 is applied to the other input of AND circuit 73, and the AND circuit 73 provides as an output a pulse train 74 which comprises a series of pulses having a pulse width equal to one half-cycle of the clock frequency separated by intervals equal to three half-cycles of the clock frequency, except for the omitted pulse 74a corresponding to the cycle of the modulatable frequency during which the output 70 of the swallow flip-flop is disabled by the phase change pulse train (DRC) 35. Thus in the frequency modulation means 40 a series of pulses 74a are swallowed at the phase change frequency (DCR) 35 during the other half-cycle of the modulation frequency 39.

The pulse trains 63 and 74 are combined by the OR circuit 64 to provide a frequency-modulated pulse train centered on the modulatable frequency (fCLK+2) 50, with pulses 63a being added to the pulse train 41 at the DRC phase change frequency 35 during one half-cycle of the modulation frequency (e.g., when its pulses are high) and pulses 74a being swallowed or subtracted from the pulse train 41 at the DRC phase change frequency 35 during the other half-cycle of the modulation frequency (e.g., when its pulses are low).

There are a number of primary concerns for the selection of digital synthesizer parameters, including the input frequencies to the exclusive OR mixers. Using, for example, the requirements for a rubidium atomic frequency standard, and more specifically a rubidium atomic frequency standard developed using the preferred embodiment, the synthesizer topology should:

1. Provide, preferably, a digital implementation readily achieved with field programmable gate array FPGA architectures commercially available (and readily converted to an inexpensive Gate Array).

2. Provide, preferably, a standard (currently 5 V) logic output signal which has a 5.3125 MHz carrier frequency that is step modulated ideally by ±300 to 1000 Hz frequency deviation from the carrier (the value depends on the physics package line width). The frequency deviation is referred to as Fdev (see FIG. 5).

3. Provide a phase shifted signal derived from the modulation frequency, user-controlled, to use for demodulating the fmod component of the servo signal from the physics package (for use both for lock detection and for developing a DC control signal to an integrator, which in turn steers the VCO of the atomic frequency standard). Also provide a second phase shifted signal derived from twice the modulation frequency, user controlled, for demodulating the 2 fmod component of the servo signal from the physics package (for use in lock detection). The phase shift steps are selected to allow proper alignment of the waveforms.

4. Provide a duty cycle for all digital waveforms (including the modulation frequency) of 50 percent (or nearly 50 percent, although a second harmonic component of the modulation will produce a unit output frequency offset; however, even small departures from 50 percent duty cycle are significant). This allows the unit's full wave demodulator to properly reject quadrature signals. Also, where the duty cycle is other than 50 percent for the mixer input frequency waveforms, the synthesizer circuit will generate additional high frequency harmonics that may rob energy from the desired harmonic frequency out of the multiplier mixer and/or generate even harmonics that will give false lock spurs or Zeeman interaction spurs.

5. Provide a modulation frequency (referred to as fmod throughout this document) in the 100 to 200 Hz area. A higher fmod permits less pulse additions/swallows per half-cycle of fmod, and also requires more microwave power. A lower fmod is more difficult to implement for the servo band pass amplifiers because of the larger capacitor and resistor values required, and is more difficult to filter out in the various supply bypass filters, especially in the critical lamp circuitry where light modulation at the modulation frequency due to such noise is indistinguishable from the true clock signal at the modulation frequency. The modulation frequency must also consider the vibration energy or mechanical resonances. The modulation frequency can be synchronized to the VCO for better and more repeatable control of spurious performance.

6. Ensure that the nearest frequency spurs of magnitude similar to the 5.3125 MHz magnitude are far enough away to avoid Zeeman transitions from interacting with the frequency spur (and generating frequency offsets at certain sharply defined values of magnetic field, i.e., C-field current). They should also be far enough away to avoid the generation of "false lock" frequency spurs; that is, harmonic frequency mixing products that lie within the "capture range" of the VCO, which is about twice the adjustment range of the variable frequency oscillator (VCO) plus the oversweep of the crystal. The former requirement is met by keeping the mixer output spurs roughly ≧625 kHz (or input spurs roughly ≧312.5 kHz).

7. Utilize an input clock frequency for this application with 5 V logic, at 20 MHz; the input clock frequency is referred to as fclk. The clock frequency selection is a complicated tradeoff between crystal availability and cost, plus lower oscillator power and less sensitivity to stray capacitances and inductances for 10 MHz and 20 MHz VCOs, against lower multiplication factors and finer synthesizer resolution/less synthesizer spurs from pulse adding/ swallowing required for higher frequencies like 40 MHz and 60 MHz and 120 MHz. Crystals with good performance at a reasonable cost are not readily available above 100 MHz at this time.

8. Ensure that an integer relationship is preserved between the input frequencies of the exclusive OR mixer 33. Otherwise, a multitude of frequency harmonics will be generated that cannot be rejected and will interfere with the unit's proper operation (and possibly give a wrong operating frequency).

At a given frequency, fc (e.g., fc=312.5 kHz), to get a given negative frequency offset, Fdev (e.g., Fdev=305 Hz), by time slipping:

{Required time slip rate in sec/sec}={Fractional frequency offset desired}={y}={fdev/fc}. [The derivation for the above equation is: For a negative frequency offset Fdev from fc, a phase slip rate of fdev $2\pi$ radians/sec at frequency fc is required. Since one complete cycle of fc is $2\pi$ radians, then the time in seconds per radian is the period of fc divided by $2\pi$, or $1/(2\pi*fc)$. The net time slip rate in sec/sec is: {#radians/sec slip rate}*{#seconds/radian at fc}. Thus, the time slip rate is, in sec/sec: y=$2\pi$ fdev/($2\pi$ fc)=fdev/fc].

To get a positive frequency offset of the same amount, the time would be advanced as opposed to slipped, but at the same rate. This embodiment works well for small phase deviations (small pulse durations) <0.2 radians p-p, which is the case of interest here. Phase steps >0.2 radians p-p begin to cause reduced power levels for the intended offset or shifted frequency. In addition, spur power levels at the phase change frequency (DRC) will begin to increase significantly.

In this frequency synthesizer the time slips/gains are implemented as time steps, using a clock pulse, or some fraction of a clock pulse.

With step changes in time as used in this invention some constraints on making the frequency steps realizable are as follows:

1. The bandwidth of the physics package must be much narrower than the frequency at which the time is being slipped or added. In atomic frequency standards, favorably narrow bandwidths can be provided by the physics package line width and possibly some contribution from the servo amplifier bandwidths.

FIG. 5 shows the time relationship between the binary frequency-modulated component 13a of the interrogation frequency and the level of the fmod signal 39.

FIG. 6 shows the phase deviation with respect to time for a fixed frequency offset Fdev comprising phase added in increments occurring during one period of the DRC frequency. The lower horizontal dashed line represents the center frequency (fc) of the frequency-modulated component 43 and the upper horizontal dashed line represents the counter frequency plus the frequency offset (fc+Fdev) with zero phase deviation from the desired offset frequency. Note that the actual instantaneous phase deviation of the frequency-modulated component (43) of the interrogation frequency is a sawtooth from that line. As time advances the sawtooth phase deviation line (43) has a slope which is proportional to the steady state frequency deviation.

The response time of a bandpass filter is an inverse function of its bandwidth. The bandwidth of the resolution bandwidth filter should be much smaller than the phase change frequency DRC (much longer response time than the DRC period) in order to integrate the phase error and realize the actual center frequency; otherwise, the frequency would not in effect be at the desired frequency for a long enough time.

Figure 7A:
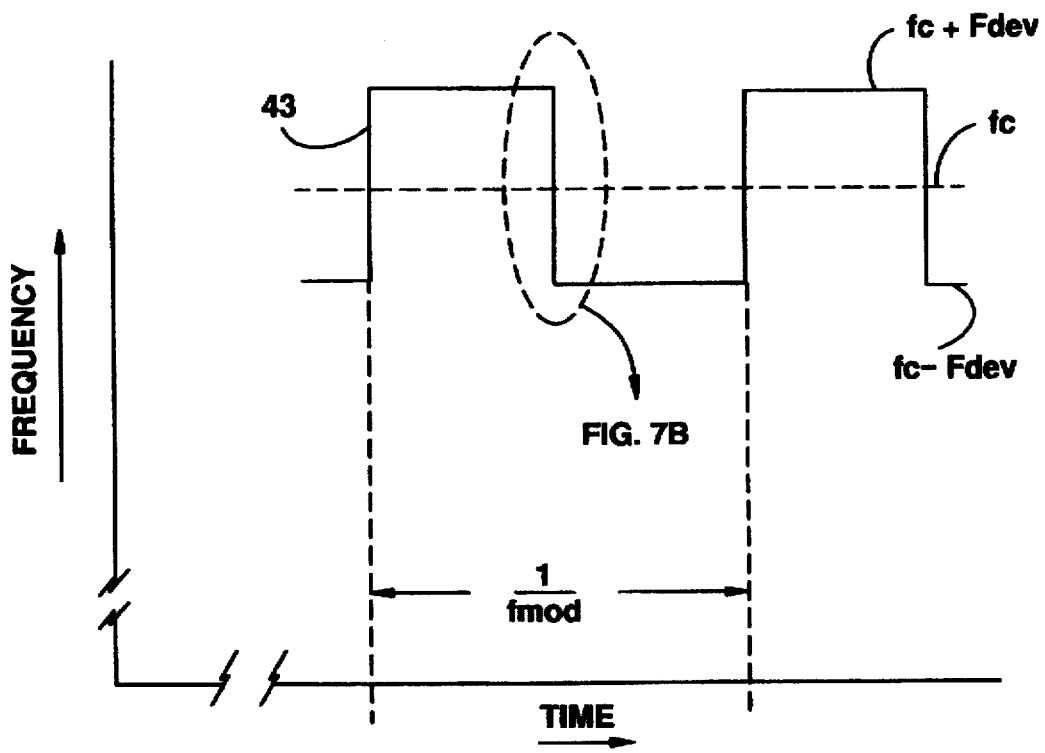
FIGS. 7A and 7B are diagrams of the output frequency and phase deviation as a function of time with the step modulation, FIG. 7A illustrating the idealized output frequency of the frequency modulator and FIG. 7B illustrating, in greater scale, phase deviation as a function of time during both half-cycles of the modulation frequency.
Figure 7B:
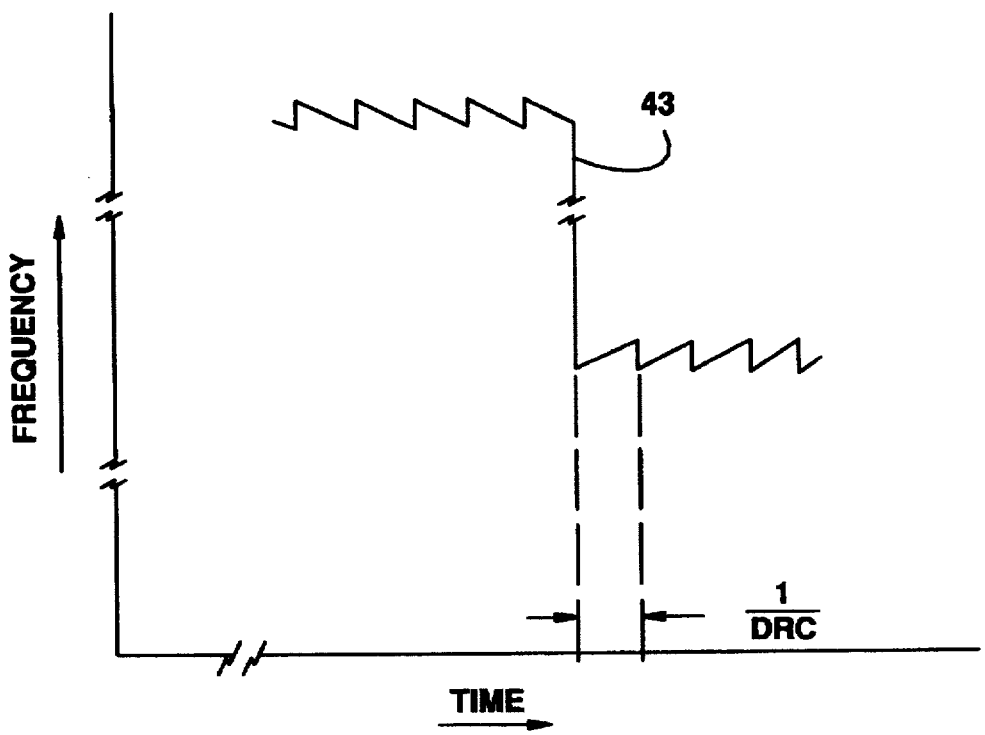

FIG. 7A shows the frequency-modulated component 43 and phase deviation as a function of time in both half-cycles of the modulation frequency (i.e., with fmod high and with fmod low) with the step modulation incorporated. At a given frequency deviation, the phase slope, in rad/sec times the period of one cycle of the DRC frequency=the total phase change. In preferred embodiments, the total phase advance should be equal in magnitude to the total phase slip imposed by the time slips over a full cycle of the modulation frequency. This operation total is demonstrated by FIG. 7B, which shows the equal phase slopes during alternate half-cycles of the modulation frequency fmod.

FIG. 8 shows the high Q bandwidth of the physics package, which filters the sideband spurs at the DRC frequency; the rubidium atoms act as a narrow band spectrum analyzer with a resolution bandwidth much narrower than the DRC spurs to provide a clean binary frequency offset signal.

2. The time slip steps must correspond to a relatively low phase change (<0.2 radians p-p) at the frequency where frequency steps are needed. For instance a $2\pi$ instantaneous phase rotation would be too large. It would be in effect an amplitude modulation as opposed to phase or frequency modulation.

3. Since the frequency is being modulated at fmod, during one-half of the fmod period the frequency is increased by Fdev (pulse adding), and during the other half of the fmod period the frequency is decreased by Fdev (pulse swallowing). There needs to be many cycles of the pulse adding/swallowing during each half of the fmod period in order to be able to ignore the "impulse" in frequency occurring at each pulse addition or swallow at the DRC frequency. This means that the phase change frequency (DRC) (e.g., swallowing/adding rate) must be >>2Fmod. In one embodiment of the invention there are 128 time adjustments per one half-cycle of fmod.

In this embodiment of the invention, the smallest time steps achievable (while remaining digital in nature) is [1/(2*Fclk)], which in this embodiment would be 25 nsec.(1/(2*20 MHz). A convenient fact about divide counters is that the time delay or advance at the input equals the time delay or advance at the output. This results in a much smaller phase step at the output frequency where it matters since the output frequency of the counter is what goes into the exclusive OR mixer.

The desired peak frequency deviation (Fdev) is around 300 to 400 Hz for a physics package which has a line width on the order of 600 or 800 Hz. Pulse swallowing/adding can be used at the 5 MHz or the 312.5 kHz input to the exclusive OR mixer 33. With the mixer the output frequency is comprised of sums and differences of the input frequencies, allowing the 300 Hz Fdev to be created at either the 312.5 kHz input or the 5 MHz input to yield the 300 Hz Fdev at the 5.3125 MHz sum frequency at the output. In addition, the relative phase change frequency (DRC) spur amplitude due to pulse swallowing or adding at either the 5 MHz or the 312.5 kHz input will accompany the 5.3125 MHz desired output. As a result the best mixer input to modulate by pulse swallowing and adding is the one which can yield the best resolution and smallest phase steps (lowest relative spur sideband energy). Since 300 Hz is a larger fraction of 312.5 kHz than of the 5 MHz, 312.5 kHz is a better choice, yielding better Fdev resolution and smaller phase steps. A 312.5 kHz phase step of 25 nsec.resolution is roughly 0.05 radians pk-pk while a 5 MHz phase step of the same 25 nsec.clock resolution is roughly 0.8 radians pk-pk. Thus, pulse swallowing/adding at 312.5 kHz is better because the phase steps are smaller, and the resulting frequency spurs from the phase change frequency (DRC) are less trouble-some than with a 5 MHz implementation. In addition, the actual power of the offset frequency begins to decay significantly with >0.2 radian p-p phase steps.

The fractional frequency offset is roughly [300 to 400]/312.5 k=[960 to 1280]×10$^{-6}$. This means that 960 to 1280 μsec/sec of time delay/advance is desirable in the 312.5 kHz divider string.

Since 25 nsec. steps are possible, assuming a 20 MHz clock with a 50 percent duty cycle, the rate of taking steps can be [960μ sec/sec÷25 nsec.=38.4×10$^3$ steps per second] to [1280μ sec/sec÷25 nsec.=51.2×10$^3$ steps per second].

The offset frequency of the carrier frequency should correspond to a range of 300 Hz to 400 Hz for typical physics packages, and the phase change frequency (swallow/add rate, or DRC) should be a submultiple of the clock frequency.

Thus, 39.0625 kHz (20 MHz÷512) would yield an actual peak Fdev of: Fdev=39.0625 kHz*25 nS*312.5 kHz=305.17578 Hz.

A convenient fmod frequency, which is a direct submultiple of the 20 MHz clock frequency, can be 152.58789 Hz [(20 MHz÷2)÷65,536].

Note that [DRC=39.0625 kHz]>>[2 fmod=305.174]; which meets the third requirement above (to realize a maximum number of phase swallows or adds during the fmod period to allow acceptable averaging).

To keep the average frequency at 312.5 kHz, and step modulate about that frequency at the fmod frequency, pulses were swallowed (or delayed) during one-half of the fmod period and pulses added (or advanced) during the other half of the fmod period.

One of the concerns about the synthesizer scheme is to prevent frequency standard false lock conditions during crystal sweeps, which normally occur only during turn-ons, to allow the VCO to lock to the desired hyperfine transition. As long as the bandwidth of the physics package can filter out the DRC frequency spurs, and provided that the phase change frequency (DRC) >>2 fmod, then the frequency step modulation of the interrogation frequency signal can be properly recognized by the physics package and used to interrogate the Rb atoms.

When the frequency standard is turned on, the VCO frequency is swept over its full range in search of a resonance to lock to. Since the DRC frequency spurs lie within the crystal sweep range, it would be possible for the VCO to lock to one of the DRC frequency spurs instead of the atomic resonance frequency if they were strong enough. In the described embodiment the first DRC spurs are present 9.76 kHz away from the desired 5.3125 MHz signal (which would yield ~a 1.43 ppm output frequency error which is not tolerable). However, these spurs are ~30 dB lower in magnitude than the desired 5.3125 MHz signal (see FIG. 16B) so that these spurs are not strong enough for the unit to lock onto.

There are two significant advantages achieved in the use of the invention compared with the prior art use of phased locked loops (PLL).

In the invention the physics package is used as the resolution bandwidth filter. The result is a large savings in cost and circuit board real estate since there is no need for a PLL's phase detector, low pass filter, and voltage controlled oscillator. The oscillator itself is a concern because if implemented with a crystal, it might have vibration and temperature range limitations. Also extra tuning for the needed trim range of the PPL would be required (to ensure that the PLL will run closed loop over the operating life and environment of the standard). If implemented passively, it might have too wide a trim range with too much "tweaking" required.

FIGS. 9A and 9B present a series of acceptable divider/ frequency combinations that may be used in the invention. FIG. 9C includes the combinations most readily obtained, and the first two combinations listed in FIG. 9C are preferred in the invention, with the first listed combination being more readily achieved.

The invention, as shown by FIG. 9C, can implement binary frequency shift keyed modulation while maintaining the center frequency output frequency which can be defined by the simple ÷64 counter from 20 MHz to 312.5 kHz. This is accomplished by swallowing and adding time pulses of the same magnitude and at the same rate on either half of the Fmod cycle. The time pulses are added on one half of the Fmod cycle to get a positive frequency offset (+Fdev), and the time pulses are swallowed on the other half of the Fmod cycle to get the negative frequency offset (−Fdev). The average or center frequency (fc) is still the 312.5 kHz.

Figure 10:
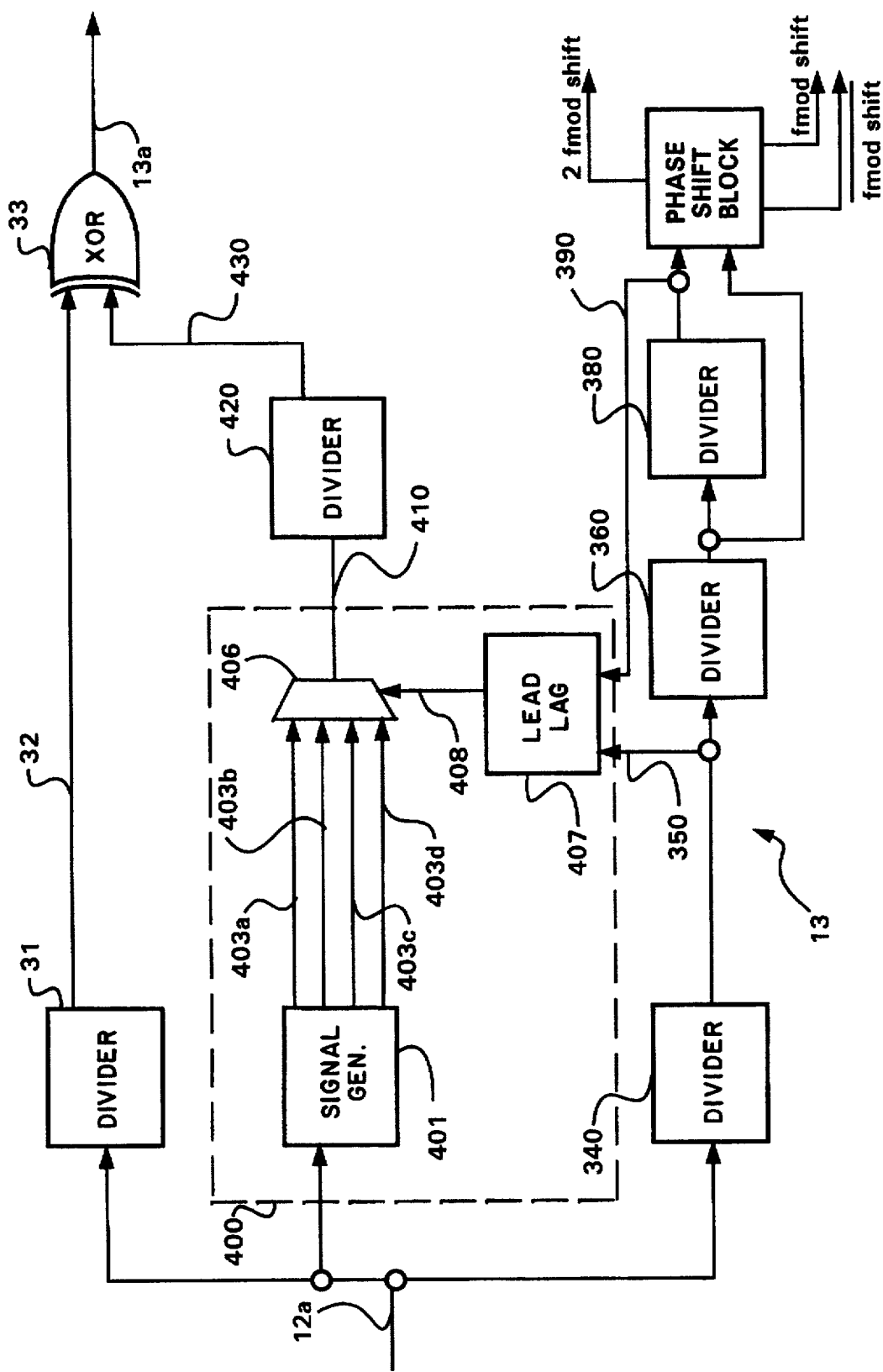
FIG. 10 is a block diagram of a preferred frequency synthesizer of the invention using multiplexing for effecting digital frequency modulation.

FIG. 10 is a block diagram of another and preferred digital frequency synthesizer 13 of the invention. In the frequency synthesizer 13, the clock frequency 12a, preferably 20 MHz, is divided by 4 by a divider/counter 31 to provide a 5 MHz frequency 32 as one input to exclusive OR mixer 33. The clock frequency 20 MHz is divided by 1024 by divider/ counter 340 to provide a phase change frequency (DRC) 350 of 19.53125 kHz, and the phase change frequency 350 is further divided by 64 by divider/counter 360 to provide a 2 fmod frequency, which is further divided by 2 by divider/ counter 380 to generate a modulation frequency 390 of 152.58785 Hz.

Frequency synthesizer 13 includes a frequency modulation means 400 with a different and preferred means for digitally varying the phase, and rate of phase change, of a modulatable frequency on alternate half-cycles of a modulation frequency.

Frequency modulation means 400 comprises a circuit 401 to generate a modulatable frequency of 10 MHz from the clock frequency 12a (which for convenience is also referred to as the "alpha frequency"), and a plurality (four) of 10 MHz modulatable frequencies, each of the plurality of 10 MHz frequencies being separated in time by 25 nsec. (i.e., separated in phase by π/2 radians at 10 MHz). The four quadrature-phased frequencies include a reference 10 MHz pulse train 403a, a 10 MHz pulse train 403b delayed by 25 nsec., a 10 MHz pulse train 403c delayed by 50 nsec., and a 10 MHz pulse train 403c delayed by 75 nsec. The quadrature-phased frequencies 403a, 403b, 403c and 403d are connected with a multiplexer (MUX) 406, which is operated by the phase change frequency pulse train (DRC) 350 and the modulation frequency (fmod) pulse train 390 to provide a frequency-modulated pulse train 410 with a carrier frequency of 10 MHz, which is divided by divider 420 (e.g., by 32) to provide the frequency-modulated component (e.g., with a center frequency (fc) of 312.5 kHz) of the interrogation frequency as the other input 430 to exclusive OR mixer 33.

The main difference between the embodiment of FIG. 10 and the embodiment of FIGS. 3 and 4 is that the embodiment of FIG. 10 delays or advances the 10 MHz modulatable frequency in 25 nsec. increments at a 39.0625 kHz rate, as opposed to the 100 nsec. steps at a 9.765625 kHz rate with the embodiment of FIGS. 4A and 4B. This is accomplished by selecting between four different 10 MHz signals which have incremental delays of 25 nsec. between them [referred to as 10 MHz-ref, (403a); 10 MHz-25 nsec., (403b); 10 MHz-50 nsec. (403c); and 10 MHz-75 nsec. (403d)].

Figure 11:
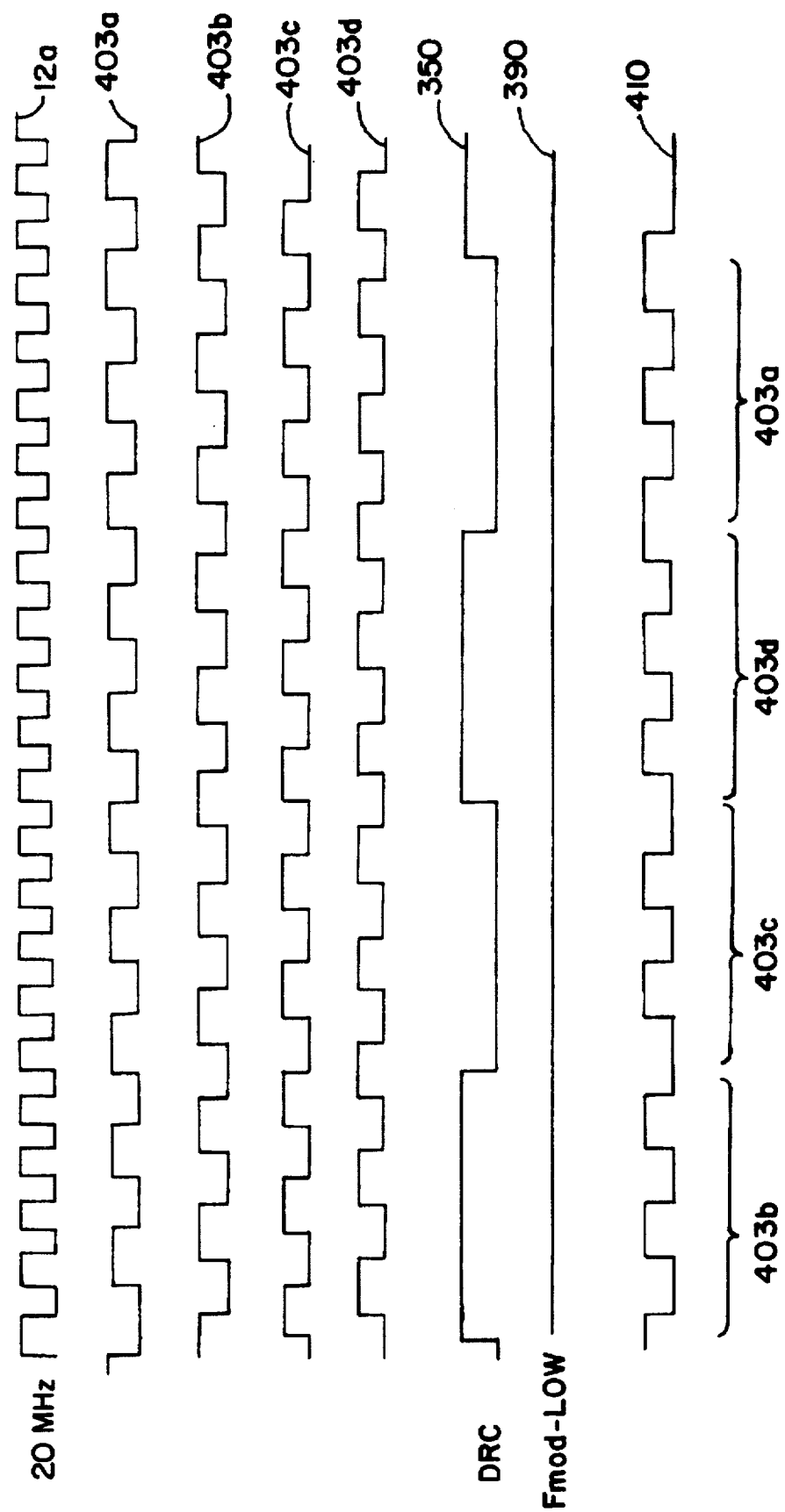
FIG. 11 is a timing diagram of the preferred embodiment of FIG. 10 during first half-cycles of the modulation frequency (e.g., with fmod low)

Referring to FIG. 11, when fmod is LOW, every edge (rising and falling) of the DRC pulses 350 switches the digital MUX 406 from the current 10 MHz modulatable frequency signal phasing (e.g., 403a) to one delayed by 25 nsec. (e.g., 403b). This in effect is rotating the phase angle in the negative direction, yielding a negative frequency offset from time step "lags". The DRC pulses 350 are generated at 19.53125 kHz; since both edges of the DRC pulses 350 are used, the 25 nsec. steps or lags are occurring at a 39.0625 kHz rate.

Figure 12:
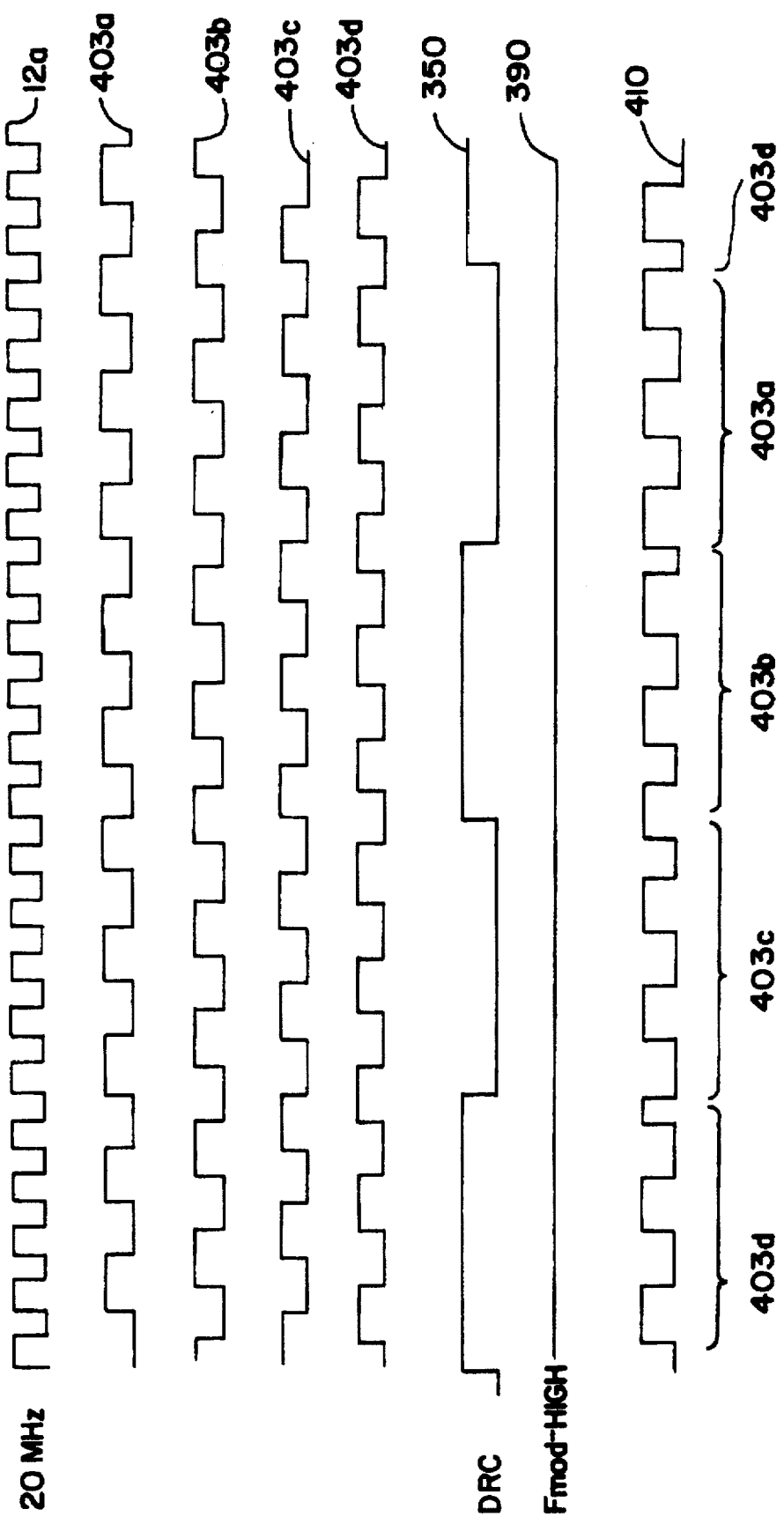
FIG. 12 is a timing diagram of the preferred embodiment of FIG. 10 during the other half-cycles of the modulation frequency (e.g., with fmod high)

Referring to FIG. 12 when fmod is HIGH, every edge (rising and falling) of the DRC pulses 350 switches the digital MUX (406) from the current 10 MHz modulatable frequency signal phasing (e.g., 403d) to one advanced by 25 nsec. (e.g., 403c). This in effect is rotating the phase angle in the positive direction, yielding a positive frequency offset from time step "leads". Since DRC signal pulses 350 are generated at 19.53125 kHz and since both edges of the DRC pulses 350 are used, the 25 nsec. steps or leads are again occurring at a 39.0625 kHz rate.

The digital MUX 406 is controlled by a lead-lag control 407 which controls MUX 406 by reversing the order of selection of the four quadrature-phased modulatable frequencies (403a–403d) at the MUX output 410 on alternate half-cycles of the modulation frequency.

Figure 13:
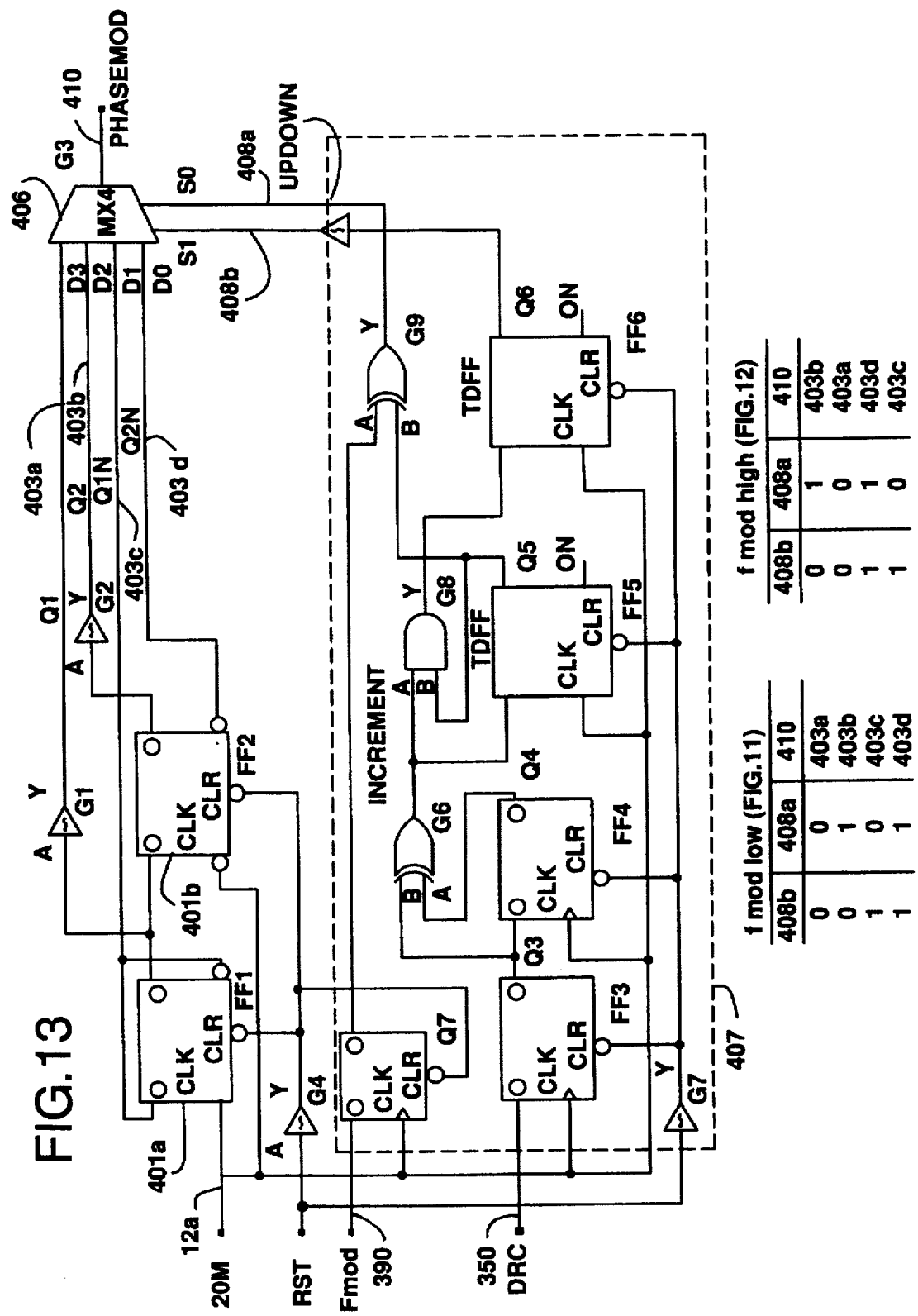
FIG. 13 is a more detailed block diagram of the frequency modulation circuit 400 of FIGS. 10–12, with tables to indicate the lead-lag control of the multiplexer.

FIG. 13 is a block diagram of a frequency modulation means 400. Divide by 2 counters FF1 401a and FF2 401b generate four 10 MHz that are separated in time by 25 nsec., which is π/2 radians at 10 MHz. Divide by 2 counter 401a generates the MUX 406 inputs 403a and its inversion 403c, which is delayed in phase by 50 nsec. (or π radians @ 10 MHz). Divide by 2 counter 401b is triggered from trailing edges (falling signal) of the clock frequency pulse train of 20 MHz to provide MUX 406 inputs 403b, which is delayed in phase by 25 nsec, or π/2 radians at 10 MHz, from MUX 406 input 403a, and its inversion 403d, which is delayed in phase by 75 nsec, or 3π/2 radians at 10 MHz, from MUX 406 input 403a. These four quadrature phased modulatable frequencies are selected in orders sequentially advancing and sequentially delaying, the modulatable 10 MHz alpha frequency in 25 nsec steps (π/2 radians or 90°) at twice the phase change DRC frequency (2*19.53125 kHz=39.0625 kHz) to provide as MUX output 410 a positive and negative rotating phase vector in the modulatable 10 MHz alpha frequency at 9.765625 kHz during alternate half-cycles of the modulation frequency. (Since one frequency cycle requires 2π steps, four π/2 steps are required per cycle, and 39.0625 kHz/4=9.765625 kHz). When divided by 32, this frequency-modulated alpha frequency 410 provides an input 430 to the exclusive OR mixer 33 of 312.5 kHz that is modulated plus and minus ~305 Hz.

Figure 14:
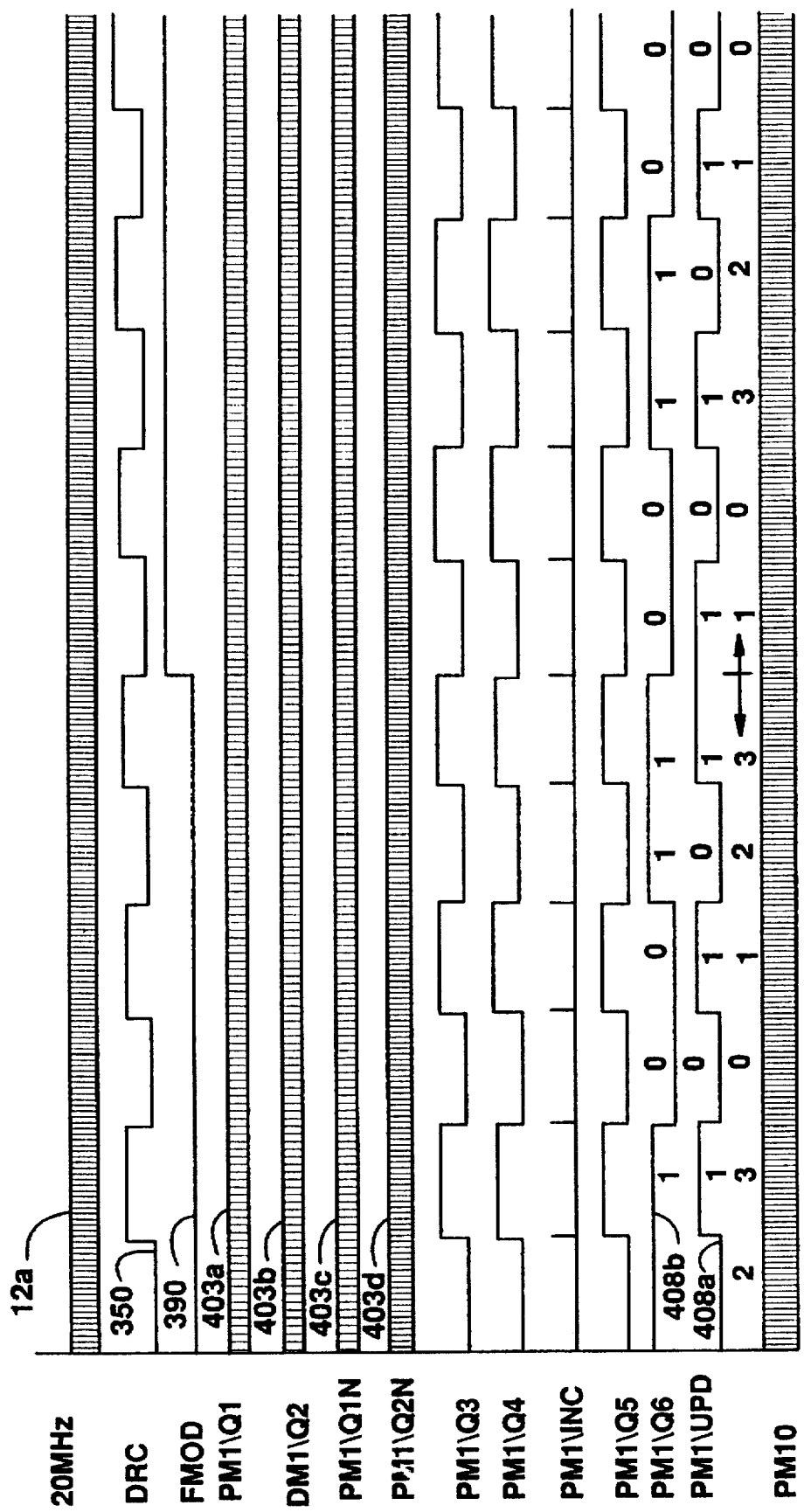
FIG. 14 is a timing diagram of the frequency modulation circuit of FIGS. 10 and 13, illustrating the generation of the lead-lag control signals.

As shown in FIGS. 13 and 14, the lead-lag control circuit 407 generates a lead-lag control input 408 to MUX 406 to sequentially select the inputs 403a–403d in an order advancing the phase of the modulatable alpha frequency output 410 in 25 nsec increments (at twice the selected DRC frequency) during the one half-cycles of the modulation frequency, and to sequentially select the inputs 403a–403d in the opposite order retarding the phase of the modulatable alpha frequency output 410 in 25 nsec increments (at twice the selected DRC frequency) during the opposite half-cycles of the modulation frequency. The lead-lag control circuit 407 controls and reverses the order of sequential selection of the MUX inputs 403a–403d by generating as control input 408, a digital control signal comprising two bits 408a, 408b from the fmod input 390 and the phase change frequency (DCR) input 350. Flip-flops FF3 and FF4 generate from the DRC, pulse train a pulse train Q3 and pulse train Q4 each duplicate the DRC pulse train 350 but are separated in time by 50 nsec so that when pulse trains Q3 and Q4 are applied as inputs A and B to exclusive OR mixer G6, the exclusive OR mixer G6 generates a series of "INCREMENT" 50 nsec pulses at both the leading and trailing edges of the DRC pulses (see PMI/INC of FIG. 14). The "INCREMENT" pulse train and the Q5 pulse train (FIG. 14) are applied as inputs A and B of AND2 circuit, which generates, during the time they are coincident, trigger pulses for flip-flop FF6, which functions as a divide by 2 counter, and generates a Q6 pulse train at one-half of the DRC frequency, which comprises the bits 408b of the lead-lag control output 408.

The bits 408a of the lead-lag control output 408 are generated by application of the frequency modulation pulse train 390, as input A, and the Q5 pulse train, as input B, to exclusive OR circuit G9. As shown by FIG. 14, when the fmod pulses are low (i.e., "0") the Q5 pulse train appears as the output 408a of the exclusive OR circuit G9, and when the fmod pulses are high (i.e., "1"), the inversion of the Q5 pulse train appears as the output 408a of exclusive OR circuit G9 (see PM1\UPD of FIG. 14). As shown by FIG. 14, the 408a and 408b pulse trains are combined to generate what can be considered a digital code with four counts (i.e., 0, 1, 2, 3). During one half-cycle of the modulation frequency (e.g., when the fmod pulses are low, or "0", the digital lead-lag control code is generated in the order 0, 1, 2, 3, 0, 1, 2, 3, etc., completing each four count cycle at one-half of the DRC pulse frequency, and during the opposite half-cycle of the modulation frequency (e.g., when the fmod pulses are high, or "1"), the digital lead-lag control code is generated in the order 3, 2, 1, 0, 3, 2, 1, 0, etc., completing each four count cycle at one-half of the DRC pulse frequency. The application of the digital lead-lag control code to MUX 406 reverses the order in which the inputs 403a–403d are passed by MUX 406 as its output 410 during alternative half-cycles of the modulation frequency 390, advancing the phase of the 10 MHz output 420 in 25 nsec (π/2 radians) at one-half of the DRC frequency during each one half-cycle of the fmod modulation frequency fmod, and retarding the phase of the 10 MHz output 410 in 25 nsec (π/2 radians) at one-half of the DRC frequency during each opposite half-cycle of the modulation frequency.

This embodiment (FIGS. 10–13) yields a finer resolution than that provided by the 100 nsec. steps at a 9.765625 kHz rate of the FIG. 4 embodiment. As explained earlier, this yields lower swallow/add frequency spur energy and more pulse swallows/adds per fmod half-cycle.

Figure 15:
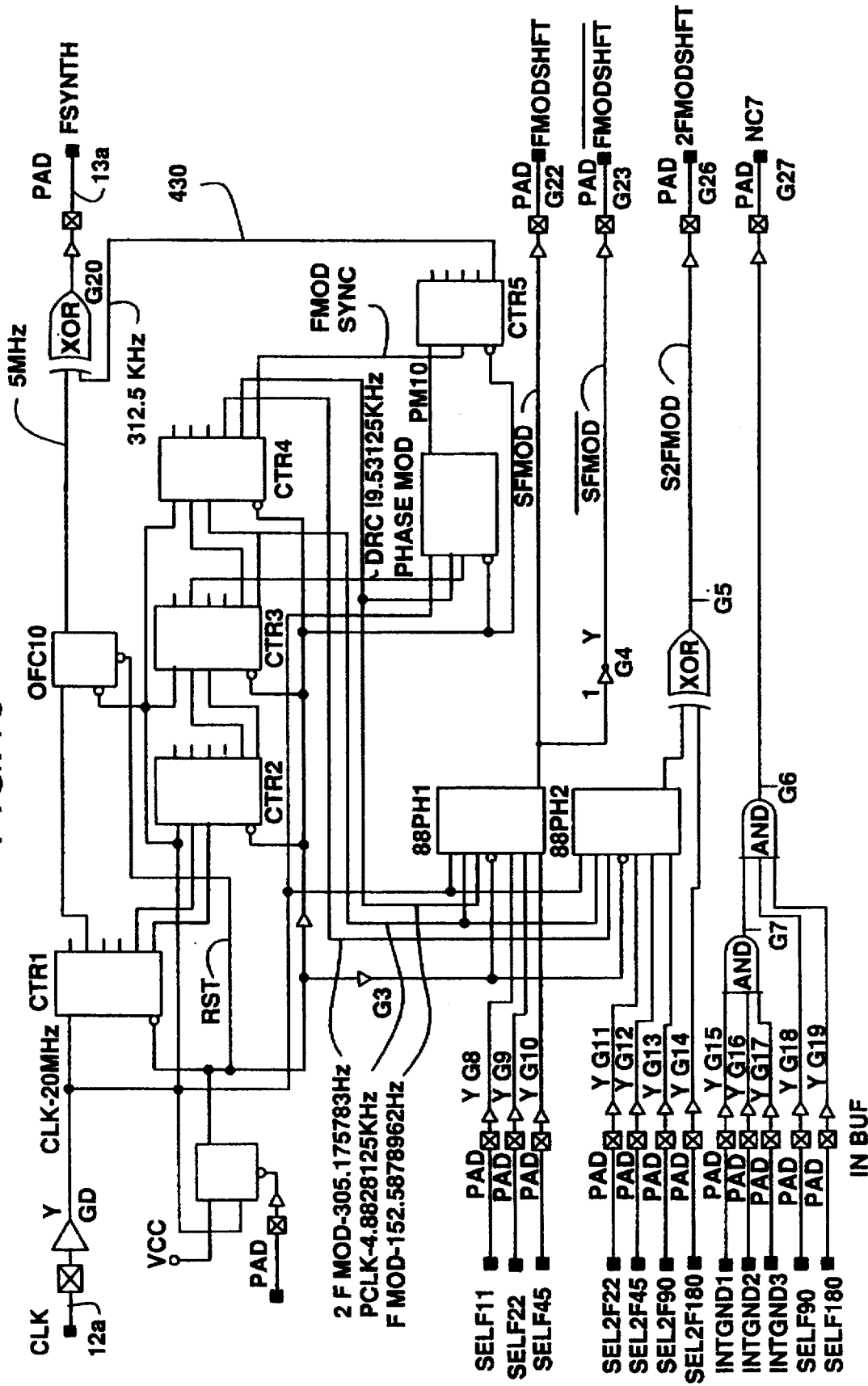
FIG. 15 is a block circuit diagram of a commercial embodiment of the invention as disclosed in FIGS. 10–14.

FIG. 15 is a block diagram of a commercial embodiment of the invention.

Figure 16A:
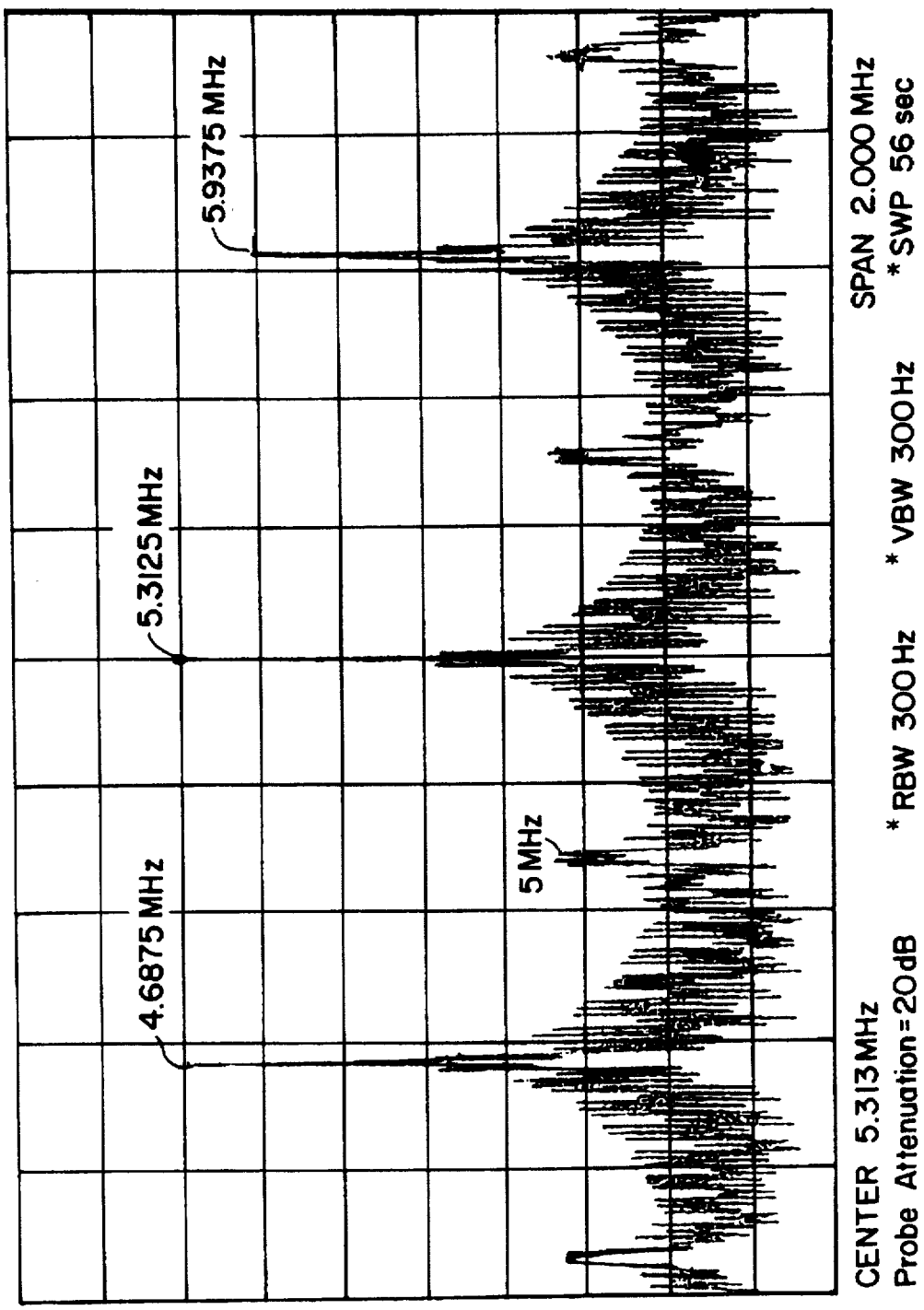
FIGS. 16A, 16B and 16C are spectrums taken of the synthesizer output signal for the preferred embodiment. The span of FIG. 16A is selected to show the major [N*312.5 kHz] spurs; the span of FIG. 16B is selected to show the DRC spurs; and the span of FIG. 16C is selected to show the modulation spurs all about 5.3125 MHz)
Figure 16B:
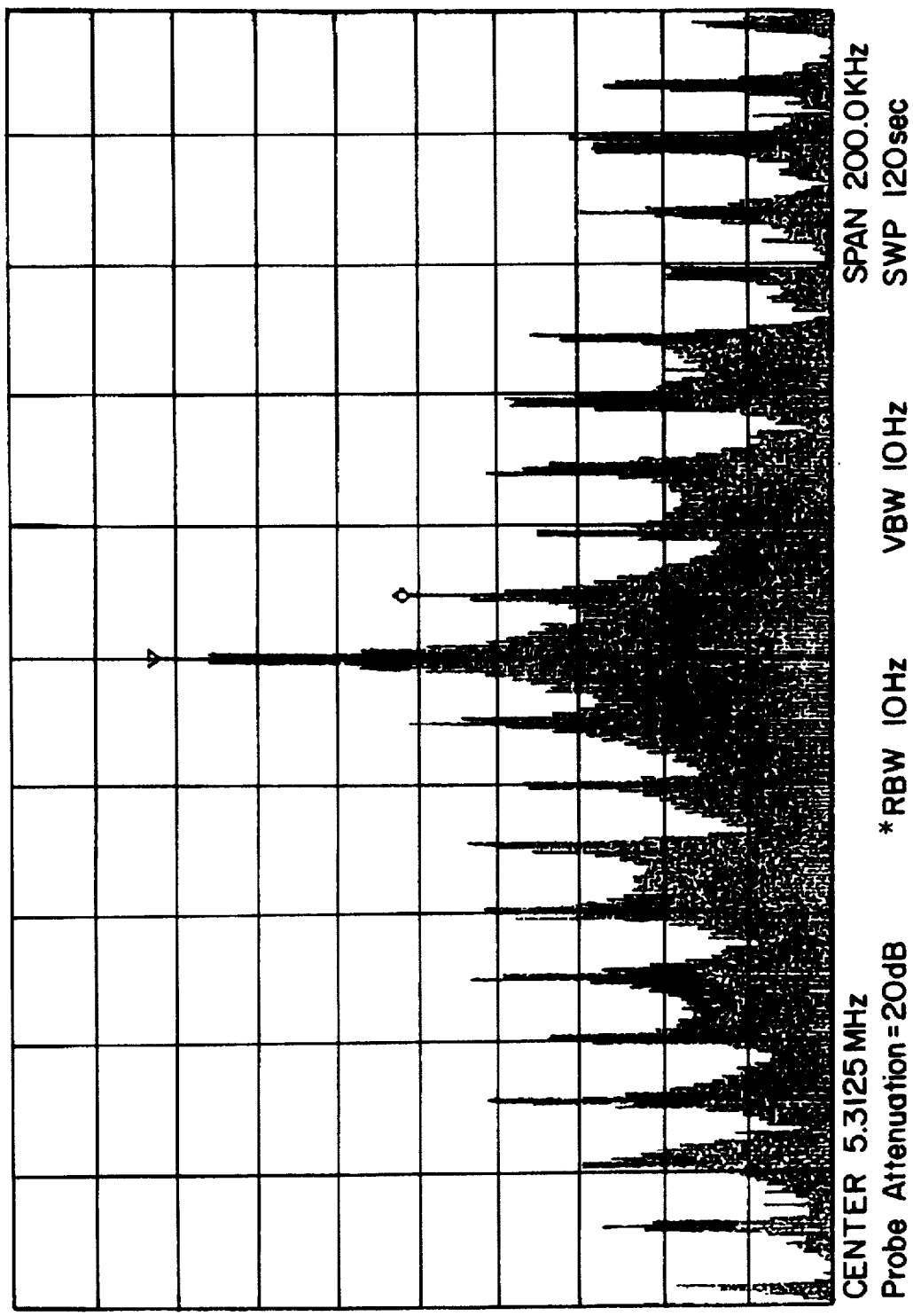
Figure 16C:
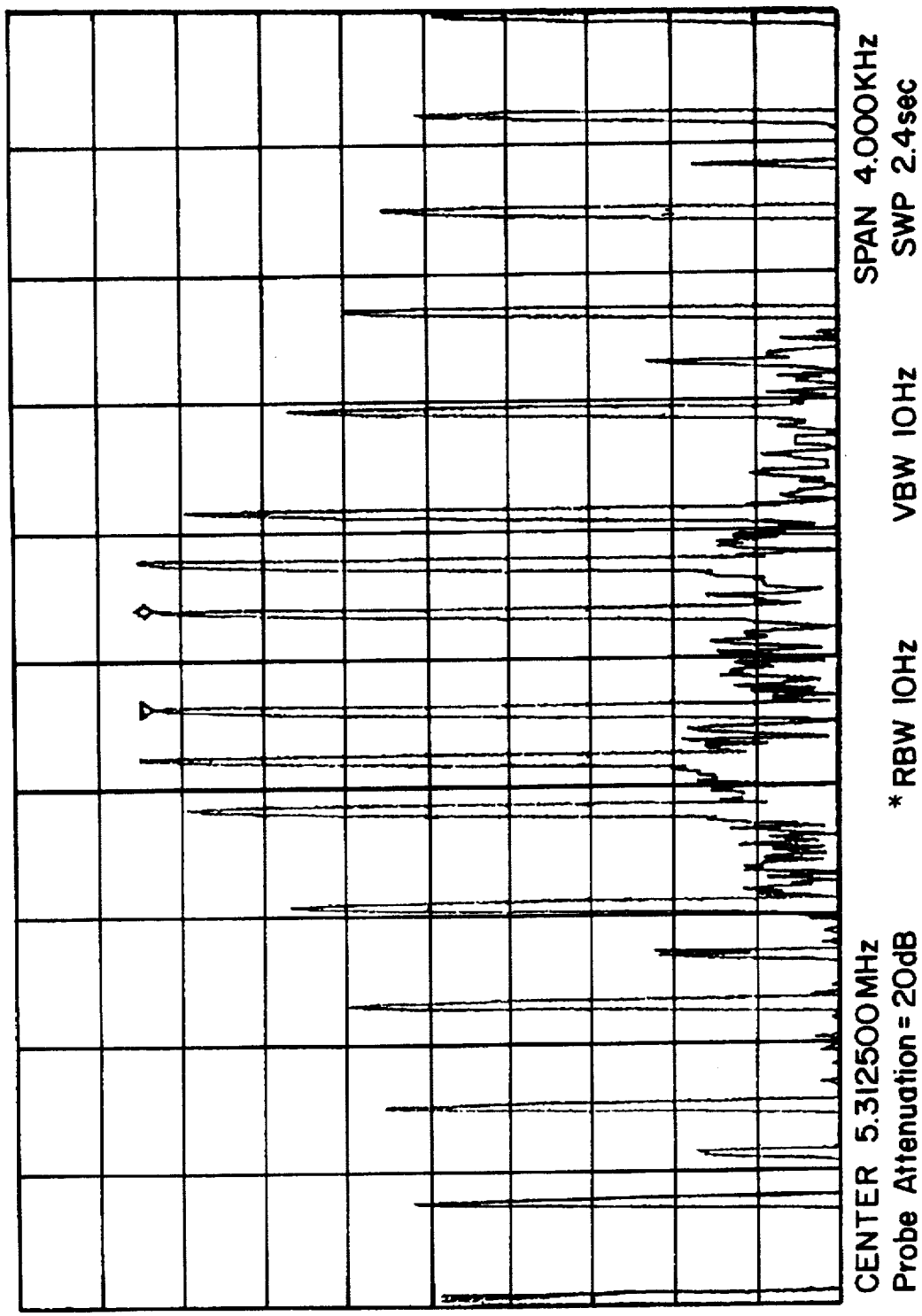

FIGS. 16A–16C show the spectrums of the modulated output measured with the preferred embodiment of the synthesizer. The upper sideband 5.9375 MHz of is ~9 dB lower than the 5.3125 MHz signal and its lower sideband of 4.6875 MHz is within 1 dB of the 5.3125 MHz signal (FIG. 16A).

In FIG. 16B, note also the presence of 9.7656 kHz spurs and its harmonics spurs resulting from the implementation. Although steps are occurring at 2x the DRC rate, equalling 39.0625 kHz, the FIG. 10 embodiment results in a repeating pattern for every four of these cycles, giving the 9.7656 kHz.

Note also from FIG. 16B that the relative amplitude of the 9.7656 kHz spur is roughly –31 dBc, and that the amplitude of the harmonics of these spurs roughly follow a 1/N relationship. Theory and breadboard verification shows –30 dBc at the DRC frequency where the DRC frequency is 9.7656 kHz and using 100 nsec. steps (rather than the preferred embodiment implementation of 25 nsec. steps). With the DRC frequency equal to 39.0625 kHz there should be no 9.7656 kHz spurs; however, as mentioned above, the preferred embodiment results in a repeating pattern at a 9.7656 kHz rate.

FIG. 16C is a "close in" look of the 5.3125 MHz that shows the modulation spectrum. The carrier is suppressed while the peak is roughly between the first and second harmonics. This is the expected spectrum achieved with binary frequency shift-keyed modulation.

Figure 17:
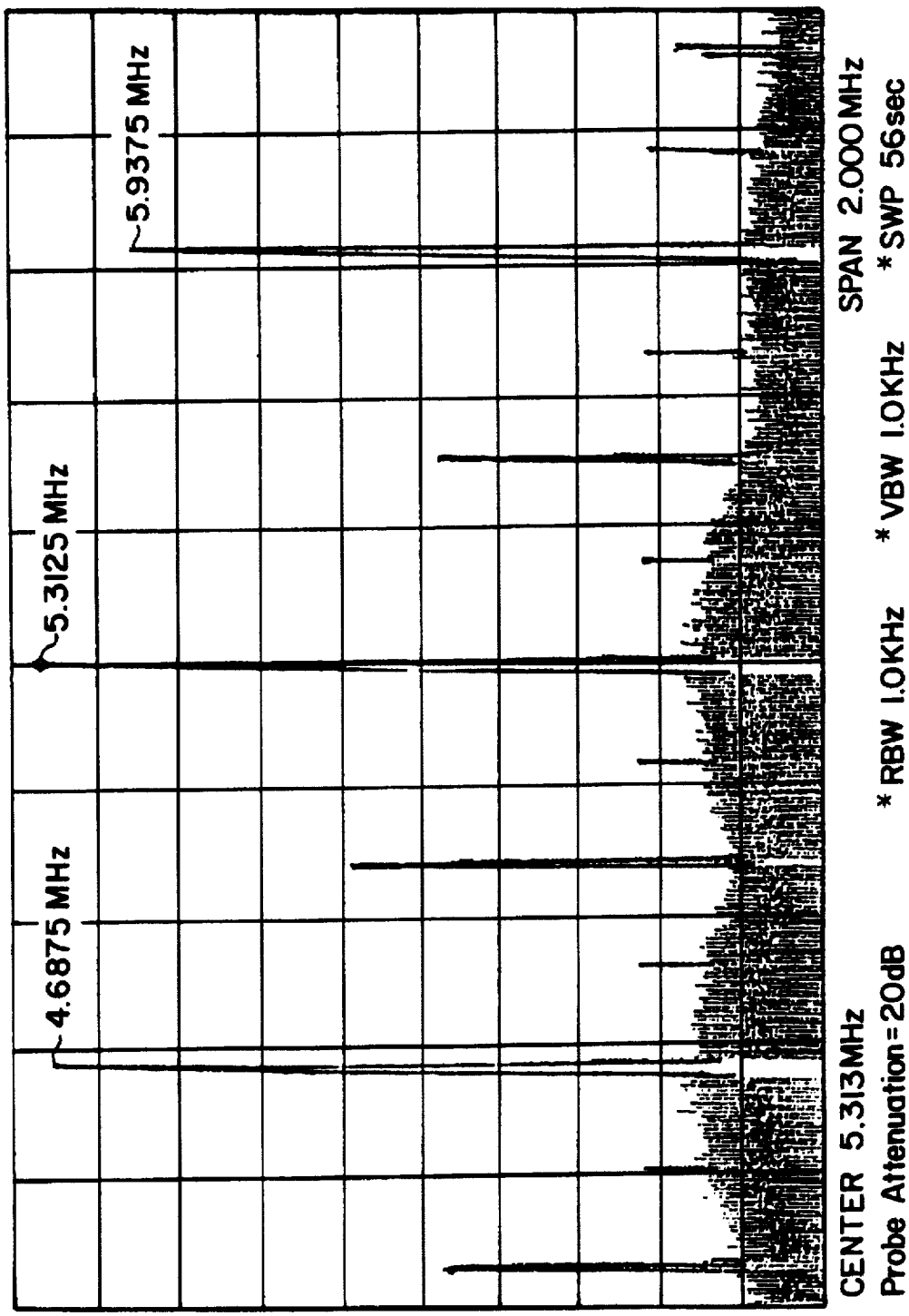
FIG. 17 is a spectrum taken of a prior art non-modulated 5.3125 MHz exclusive OR mixer for comparison.

Since the waveforms are from a synthesizer with step frequency modulation implemented, the absolute amplitudes measured did not correspond to the simplistic predictions (which didn't factor the modulation into account). With the modulation incorporated and with roughly ±305 Hz resolution bandwidth on the spectrum analyzer, the measured amplitude of the 5.3125 MHz spur is about 7 dB less than predicted. However, FIG. 17 is the spectrum of an exclusive OR implementation without any modulation; this yielded 1.33 VRMS (with 4.8 Vp-p measured) at 5.3125 MHz, which compares favorably to the theoretical output of 1.43 VRMS derived above.

Figure 18:
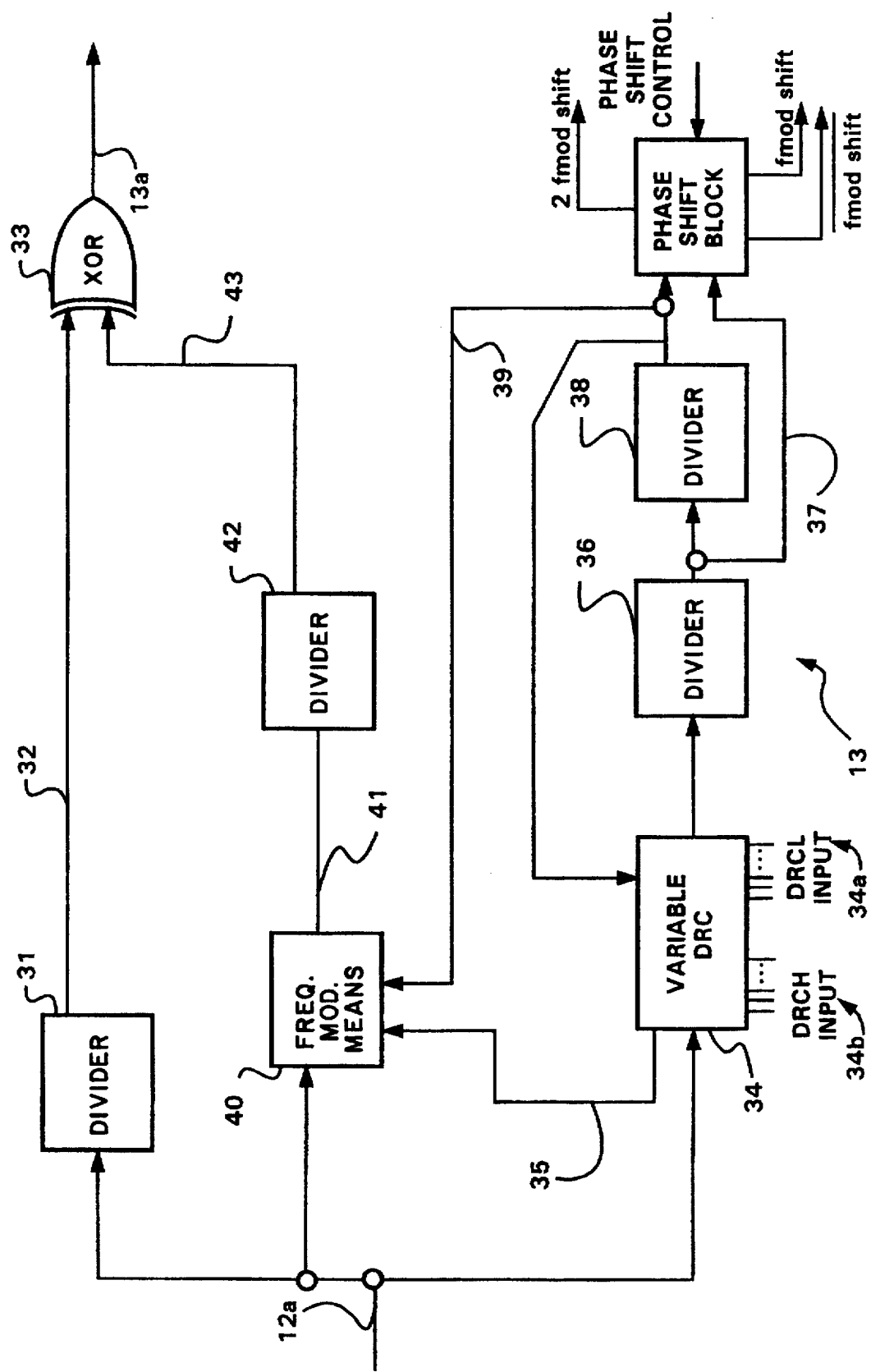
FIG. 18 is a block diagram of an embodiment of the invention, which provides programmable frequency control.
Figure 19:
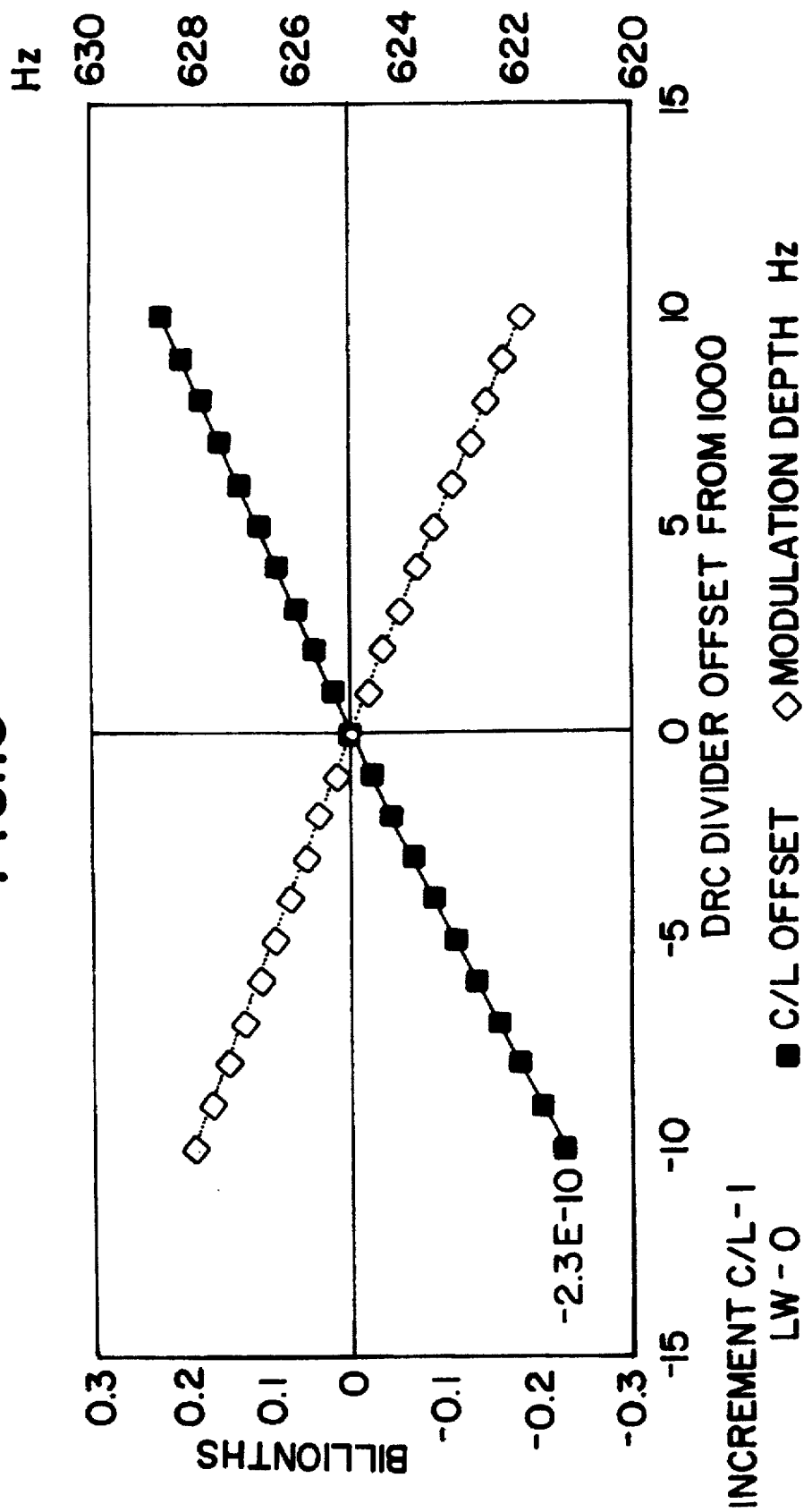
Figure 21:
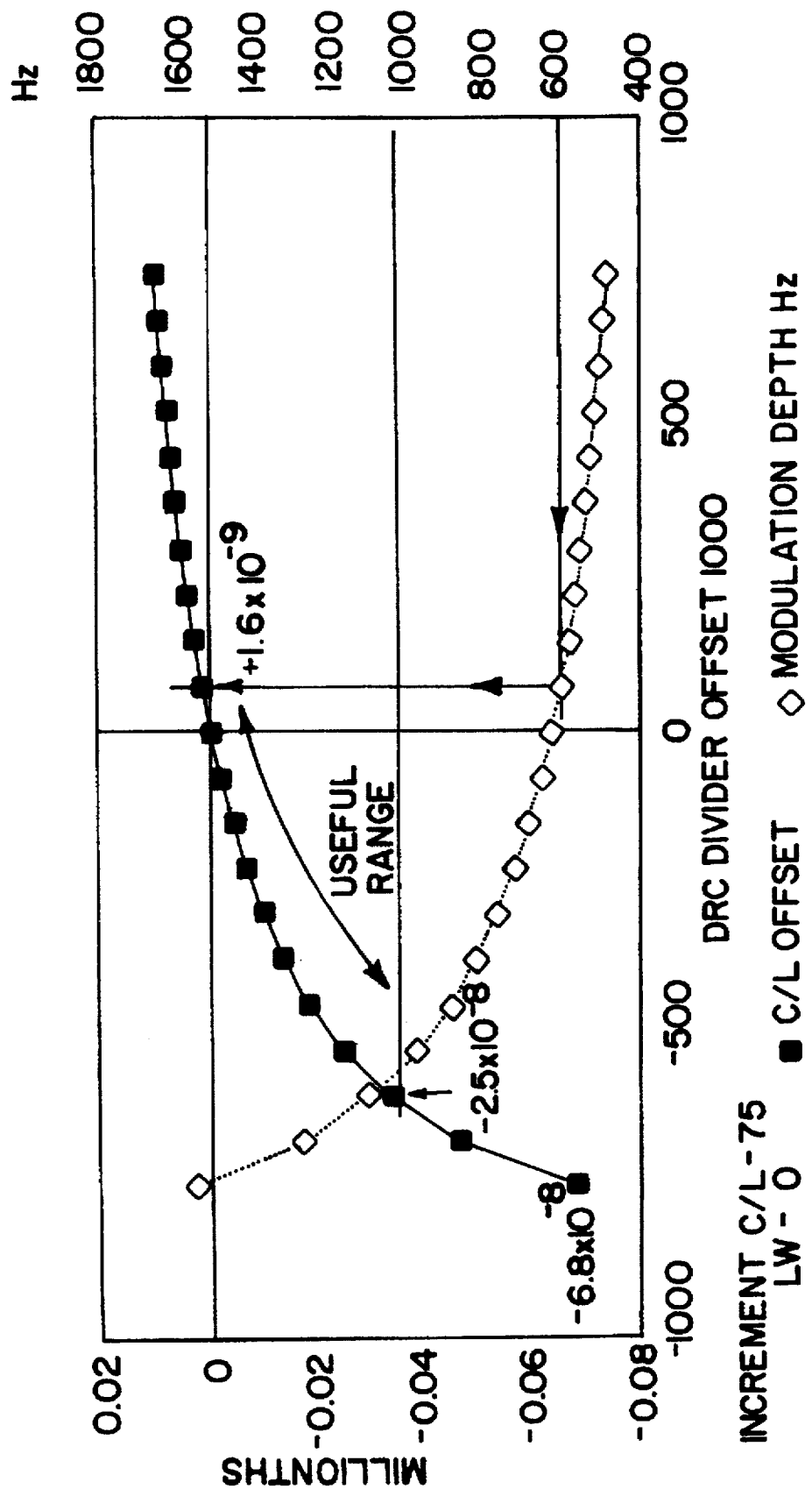
Figure 23:
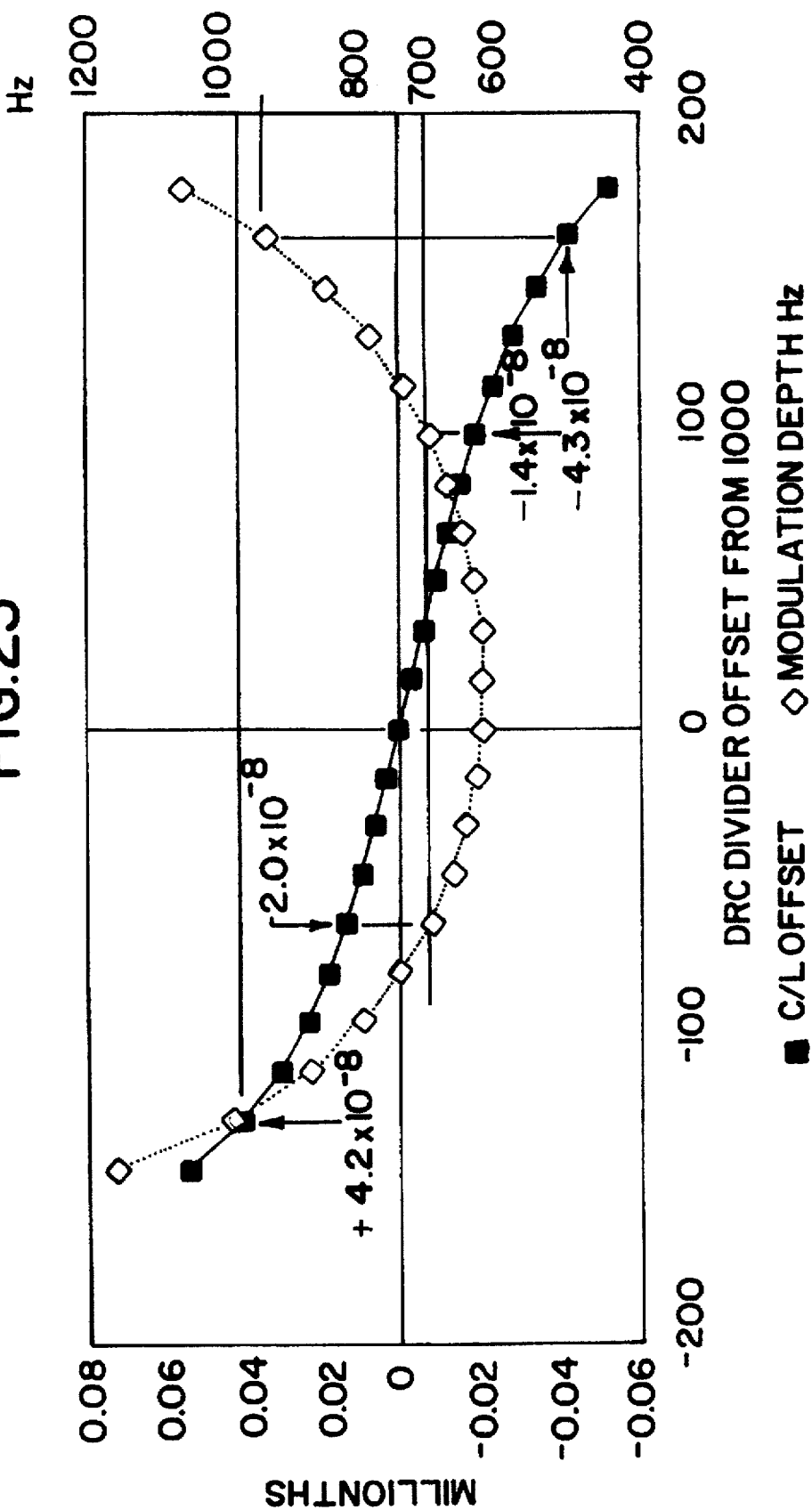

FIG. 18 further shows an embodiment of the invention of FIGS. 3, 4A and 4B, and 10–12 which provides for fine tuning of the output frequency and/or the modulation depth of the atomic frequency standard using inputs by jumpers or by external programming. This is accomplished by having the option to program the DRC divider 34 to a unique value for when fmod is high (DRCH) and another unique value when fmod is low (DRCL). For instance in a preferred embodiment if the DRC divider value of divider 34 is decreased by one (999) when fmod is high and left as is (1000) when fmod is low, the output fractional frequency will be adjusted by 2.2e–11 with only a modulation depth increase of 0.31 Hz. Of course, other variations can be effected in the DRC phase change frequency during one or both half-cycles of the modulation frequency.

This invention thus provides the ability to adjust the DRC phase change frequency to yield fine frequency control and/or modulation depth control. One use of the fine frequency control in the atomic frequency standard is to overcome the physics package offsets potentially minimizing the expense of adjusting the physics package frequency during its manufacturing process.

In order to achieve fine frequency control of the atomic frequency standard, without changing the modulation depth, the DRC frequency can be altered by a positive delta frequency (+αf) for fine frequency control while the modulation signal is high, and the DRC frequency can be altered by a negative delta frequency (–αf) for fine frequency control when the modulation signal is low.

In order to achieve a modulation depth control, without changing the frequency offset, the DRC frequency can be altered by a positive delta frequency (+αf) for modulation depth control for both the high and low states of the modulation signal.

These variable divisions can be controlled using a presettable counter 34, loaded with one value (DRCL) when fmod is low and a separate value (DRCH) when fmod is high. These input digital words can be programmed into the synthesizer with manual jumpers from outside of the synthesizer. An additional possibility would be with a counter inside the FPGA with the ability to count up or down in order to externally program the DRCH and DRCL inputs. An initial value would be internally set on power up then incremented from outside the chip or unit.

The DRC variable counter would be reset and then reloaded on each fmod transition. This would eliminate any beat frequency below fmod. Since DRCH and DRCL are only present during ½ the fmod cycle they would be 6 dB lower than the model using a fixed DRC frequency.

Thus, the invention provides the ability to adjust phase change frequency, or the DRC count ratio, using a different count when fmod is low or high. The DRCH, when fmod is high, and the DRCL, when fmod is low, can be moved singly or together up or down adjusting the unit frequency, or together or apart adjusting modulation depth. FIGS. 19–24 illustrate many possible adjustments in the phase change frequencies, or DRC count rates, and the resulting fine frequency and modulation depth control. For example, if the DRCH count is alone adjusted up one count, the unit will center 2.2e–11 higher. The change in the modulation depth is 0.31 Hz which is not significant. If the modulation depth is limited to 600 to 800 Hz, no unit degradation will result. A modulation range of 600–1000 would result in a small degradation in the short term stability from an average <1e–11 to 1.4e–11 Allan deviation at one second (T) which is still easily within acceptable specifications. The result of holding one DRCL constant and sweeping DRCH up provides a useful frequency range of 1.0e–8 with resolution of 2.28e–11. Allowing the modulation depth to reach almost 1000 Hz extends the useful range to 2.5e–8.

If both DRCL and DRCH are allowed to move, using DRCH to change the frequency and compensating the modulation depth with DRCL, the range becomes 3.4e–8 for modulation depths up to 800 Hz and 8.53-8 up to 1000 Hz.

Those skilled in the art will realize that other embodiments of the invention may be devised without departing from the scope of the invention as defined by the following claims and the prior art.

We claim:

1. In a method of digitally generating a frequency-modulated physics package interrogation signal in an atomic frequency standard, the improvement comprising generating a digital frequency component of the interrogation signal and a digital modulation frequency from a clock frequency, and varying the rate of phase change of the digital frequency component on alternate half-cycles of the digital modulation frequency.

2. The method of claim 1 wherein the rate of phase change is varied by multiplexing pulse trains with several different phases of an alpha frequency generated from the clock frequency.

3. The method of claim 2 wherein four digital phases are generated from the leading and trailing edges of a frequency twice the alpha frequency.

4. The method of claim 3 wherein the pulse trains with four different phases of the alpha frequency are multiplexed at a phase change frequency that is a submultiple of the clock frequency.

5. The method of claim 4 wherein the pulse trains with four different phases are multiplexed in one order in one half-cycle of the modulation frequency and in an inverse order in the other half-cycle of the modulation frequency.

6. The method of claim 5 wherein the order of multiplexing of the pulse trains with four different phases is reversed on the alternate half-cycles of the modulation frequency by a digital code input to the multiplexer.

7. The method of claim 6 wherein the digital code is generated from the phase change frequency.

8. The method of claim 7 wherein the digital code is generated from a first pulse train at half the phase change frequency and a second pulse train at a quarter of the phase change frequency.

9. The method of claim 8 wherein the digital code is changed on alternate half-cycles of the modulation frequency by inverting the first pulse train.

10. The method of claim 2 wherein said alpha frequency is a submultiple of clock frequency.

11. The method of claim 1 wherein the rate of phase change is provided at different phase change frequencies on alternate half-cycles of the modulation frequency.

12. The method of claim 11 wherein each of the different phase change frequencies are submultiples of the clock frequency.

13. The method of claim 1 wherein the rate of phase change is varied by multiplexing N signals at an alpha frequency, each of the N signals being separated in phase by $2\pi/N$ radians of the alpha frequency, and wherein the N signals are multiplexed at a rate to provide an output signal with a phase variation from the alpha frequency in a multiple of $2\pi$ radians at the alpha frequency.

14. The method of claim 5 wherein the order of multiplexing of the pulse trains with four different phases are controlled by two pulse trains, generated from the phase change frequency, said pulse trains being combined to provide a series of sequential two bit words applied for switching of the multiplexer.

15. The method of claim 14 wherein the two pulse trains are combineable into two bit words for counts of 0, 1, 2 and 3.

16. The method of claim 15 wherein by inversion of the pulse train generated at the modulation frequency reverses the order of switching by the multiplexer of the four differently phased pulse trains.

17. The method of claim 1 wherein the rate of phase change is incremented positively and negatively on alternate half-cycles of the modulation frequency.

18. The method of claim 17 further comprising the step of generating one or more delayed digital frequency components of the interrogation frequency, and multiplexing the one or more delayed digital frequency components with an undelayed digital frequency component of the interrogation frequency in each half-cycle of the modulation frequency to advance the phase of the digital frequency component in one half-cycle of the modulation frequency and to delay the phase of the digital frequency component in the other half-cycle of the modulation frequency.

19. The method of claim 17 wherein the rate of phase change is incremented positively by adding pulses to, and is incremented negatively by removing pulses from, the digital frequency component.

20. In digital means for generating a frequency-modulated physics package interrogation signal in an atomic frequency standard including means for generating a clock frequency, the improvement comprising means for generating a plurality of digital components of the interrogation signal from the clock frequency; means for varying the rate of phase change of one of the digital frequency components of the interrogation signal; and means for combining the plurality of digital components of the interrogation signal and providing the frequency-modulated interrogation signal.

21. The improvement of claim 20 wherein said means effects phase variation by phase delay and phase advance in digital frequency shift keyed modulation.

22. The improvement of claim 21 wherein phase advance is effected by pulse addition to the digital frequency component and phase delay is effected by pulse swallowing from the digital frequency component.

23. The improvement of claim 20 wherein said means effects phase delay and phase advance by multiplex selection of a plurality of variably phased digital frequency components of the interrogation frequency.

24. The improvement of claim 21 wherein phase delay and phase advance are generated by synchronized sequential division by any two or more integral divisors.

25. In an atomic frequency standard including a controllable frequency source for generating a source output frequency, a physics package for generating an atomic transition frequency through the excitation of an atomic gas, means for generating, from the source output frequency, a modulated interrogation frequency, means for injecting and mixing said modulated interrogation frequency with said atomic transition frequency, means for generating a signal proportional to the difference between said atomic transition frequency and said modulated interrogation frequency and means for controlling said controllable frequency source from said signal and for locking said controllable frequency source to said atom transition frequency, the improvement wherein said means for generating, from the source output frequency, a modulated interrogation frequency comprises digital means for synchronously synthesizing a plurality of integrally-related submultiple frequencies of said source output frequency and an integrally-related modulation frequency, one of said integrally-related submultiple frequencies being frequency-modulated by the addition and subtraction of pulses at said integrally-related modulation frequency, and means for digitally mixing said plurality of integrally-related submultiple frequencies, including said frequency-modulated submultiple frequency, in synthesizing said modulated interrogation frequency.

26. In a method of digitally synthesizing a frequency-modulated microwave signal for exciting a physics package of an atomic frequency package, the improvement comprising the steps of:

generating from said clock frequency a submultiple frequency with a period T;

generating from said submultiple frequency N variously delayed signals, each of said N signals comprising the submultiple frequency delayed by a time T/N from each of the other N signals;

providing each of said N variously delayed signals to a multiplexer;

generating a multiplexer operating signal by generating a phase change frequency (DRC) pulse train signal by dividing the clock signal by a substantial number, and generating a frequency modulation signal by dividing the phase change frequency (DRC) pulse train signal by a further substantial number, and combining the phase change frequency (DRC) pulse train signal and the frequency modulation signal for operation of said multiplexer to provide an output frequency with one or more periods of T between the transition edges of the phase change frequency (DRC) pulse train signal and with one period of (T+T/N) at each edge of each pulse of the phase change frequency (DRC) pulse train signal during one half-cycle of the frequency modulation signal, and for operation said multiplexer or provide an output frequency with one or more periods of T between the transition edges of the phase change frequency (DRC) pulse train signal and with one period of (T−T/N) at each edge of each pulse of the phase change frequency (DRC) pulse train signal during the other half-cycle of the frequency modulation signal.

27. In a method of digitally synthesizing a frequency-modulated microwave signal from a clock frequency of an atomic frequency standard for use with a physics package in controlling the clock frequency, the improvement comprising:

generating, by dividing said clock frequency, (a) a modulatable frequency, (b) a modulation frequency selected for effective interaction with the physics package, and (c) a phase change frequency (DRC) which is substantially smaller than the modulatable frequency and substantially larger than the modulation frequency, and modulating said modulatable frequency by adding phase shift to the modulatable frequency at the phase change frequency (DRC) during one half-cycle of the modulation frequency and by subtracting phase shift from the modulatable frequency at the phase change frequency (DRC) during the other half-cycle of the modulatable frequency, the phase shift of said modulatable frequency being zero over each cycle of the modulation frequency.

28. The method of claim 27 wherein the clock frequency is 20 MHz, the modulatable frequency is 10 MHz, the modulation frequency is 152.58789 Hz and the phase change frequency (DRC) is 19.53125 kHz.

29. The improvement of claim 27 wherein the phase change frequency (DRC) is programmable to yield fine frequency control of the atomic frequency standard by programming unique phase change frequencies (DRC) for when the modulation signal is high and for when the modulation frequency is low.

30. The method of claim 29 wherein the phase shift change frequency (DRC) is programmed by hardware jumpers connected to the synthesizer circuit.

31. The method of claim 29 wherein the phase shift change frequency (DRC) is programmed by external control methods.

32. In an atomic frequency standard including means for generating from a clock frequency, a digital frequency-modulated microwave signal for application to a physics package the improvement comprising means for generating, from said clock frequency, a microwave submultiple frequency with a period T and for generating from said microwave submultiple frequency a plurality of N pulse trains at said submultiple frequency, said pulse trains being delayed from each other by a period T/N; and means for generating, from said plurality of N delayed pulse trains, a frequency-modulated digital signal comprising means for combining said plurality of delayed pulse trains, said combining means being operated by a modulation frequency and a phase change frequency (DRC) pulse train, said phase change frequency (DRC) pulse train operating said combining means to switch its output among the plurality delayed pulse trains to provide a pulse train output with an instantaneous frequency of 1/T for one or more periods between the transition edges of the phase change frequency (DRC) pulse train and with an instantaneous frequency of 1/(T+T/N) for one period at each pulse edge of the phase change frequency (DRC) pulse train during one half-cycle of the modulation frequency signal, and for operation of said multiplexer to provide an output instantaneous frequency of 1/T for one or more periods between the transition edges of the phase change frequency (DRC) pulse train and with an instantaneous frequency of 1/(T−T/N) for one period at each pulse edge of the phase change frequency (DRC) pulse train during the other half-cycle of the modulation frequency.

33. A method of controlling a frequency-modulated interrogation signal in an atomic frequency standard, comprising:

generating, from a clock frequency of the atomic frequency standard, a frequency for modulation of the interrogation signal and a phase change frequency;

using the phase change frequency to provide a different rate of phase change of the interrogation signal in alternate half-cycles of the modulation frequency; and controlling the rate of phase change in modulating the interrogation signal by varying the phase change frequency.

34. The method of claim 33 wherein the phase change frequency is changed in one half-cycle of the modulation frequency.

35. The method of claim 33 wherein the phase change frequency is changed in both half-cycles of the modulation frequency.

36. Means for generating a frequency-modulated component of an interrogation frequency from the clock frequency of an atomic frequency standard, comprising means for generating a phase change frequency from said clock frequency;

means for generating a modulation frequency from said clock frequency;

means for generating, from said clock frequency, said phase change frequency and said modulation frequency, the frequency-modulated component of the interrogation frequency with different rates of phase change on alternate half-cycles of the modulation frequency.

37. The means of claim 36 wherein said means for generating a phase change frequency is controllable and can provide a different phase change frequency an alternate half-cycles of the modulation frequency.

38. The means of claim 37 wherein said means for generating a phase change frequency is connected with an outside control source for changing the phase change frequency.

39. The means of claim 37 wherein said means for generating a phase change frequency is controllable to change the phase change frequency in one or both half-cycles of the modulation frequency.

40. The means of claim 36 wherein said means for generating a frequency-modulated component of the interrogation signal from said clock frequency, said phase change frequency and said modulation frequency comprises a multiplexer.

* * * * *